United States Patent
You et al.

(10) Patent No.: US 7,615,289 B2
(45) Date of Patent: *Nov. 10, 2009

(54) ORGANIC ELECTROLUMINESCENT POLYMER HAVING 9,9-DI(FLUORENYL)-2,7-FLUORENYL UNIT AND ORGANIC ELECTROLUMINESCENT DEVICE MANUFACTURED USING THE SAME

(75) Inventors: Hong You, Daejeon (KR); Weon Jung Choi, Daejeon (KR); Dong Cheol Shin, Daejeon (KR); Sang Soo Lee, Daejeon (KR); Jae Kyu Jin, Daejeon (KR); Jong Wook Kim, Daejeon (KR); Soon Ki Kwon, Gyeongsangnam-do (KR); Yun Hi Kim, Gyeongsangnam-do (KR)

(73) Assignee: SK Energy Co., Ltd., Seoul (KR)

( * ) Notice: Subject to any disclaimer, the term of this patent is extended or adjusted under 35 U.S.C. 154(b) by 527 days.

This patent is subject to a terminal disclaimer.

(21) Appl. No.: 10/596,842

(22) PCT Filed: Jan. 28, 2005

(86) PCT No.: PCT/KR2005/000263

§ 371 (c)(1),
(2), (4) Date: Jun. 27, 2006

(87) PCT Pub. No.: WO2005/073337

PCT Pub. Date: Aug. 11, 2005

(65) Prior Publication Data
US 2007/0093643 A1    Apr. 26, 2007

(30) Foreign Application Priority Data
Jan. 30, 2004    (KR) .................. 10-2004-0006226
Jan. 27, 2005    (KR) .................. 10-2005-0007522

(51) Int. Cl.
*H01L 51/54* (2006.01)
*C09K 11/06* (2006.01)

(52) U.S. Cl. ................ 428/690; 428/917; 528/4; 313/504; 313/506; 252/301.16; 257/40; 257/E51.032

(58) Field of Classification Search .......... 428/690, 428/917; 313/504, 506; 257/40, E51.023, 257/E51.032; 526/280; 528/4, 86, 211, 394, 528/397, 422

See application file for complete search history.

(56) References Cited

U.S. PATENT DOCUMENTS

| 5,807,974 | A | 9/1998 | Kim et al. |
| 6,255,449 | B1 | 7/2001 | Woo et al. |
| 6,309,763 | B1 | 10/2001 | Woo et al. |
| 6,517,957 | B1 | 2/2003 | Senoo et al. |
| 6,605,373 | B2 | 8/2003 | Woo et al. |
| 6,617,051 | B1 | 9/2003 | Higashi et al. |
| 6,652,997 | B2 | 11/2003 | Suzuki et al. |
| 6,653,438 | B1 | 11/2003 | Spreitzer et al. |

FOREIGN PATENT DOCUMENTS

WO    WO0277060    3/2002

OTHER PUBLICATIONS

M. Pope, et al., Electroluminescence in Organic Crystals (Dec. 1962).
C.W. Tang, et al., Organic Electroluminescent Diodes (May 1987).
R. H. Friend, et al., Light-emitting diodes based on conjugated polymers (Oct. 1990).

*Primary Examiner*—D. Lawrence Tarazano
*Assistant Examiner*—Michael Wilson
(74) *Attorney, Agent, or Firm*—Darby & Darby P.C.

(57) ABSTRACT

Disclosed herein is an organic electroluminescent polymer having 9,9-di(fluorenyl)-2,7-fluorenyl unit and an electroluminescent device using the same. Specifically, the current invention provides an organic electroluminescent polymer having 9,9-di(fluorenyl)-2,7-fluorenyl unit, which can be used as a blue electroluminescent polymer and host material by introducing the substituted fluorenyl group at the 9-position of fluorene, and an electroluminescent device using the electroluminescent polymer. The electroluminescent polymer is applicable as a host material for highly pure blue, green and red, having high solubility, high heat stability and high quantum efficiency.

-continued
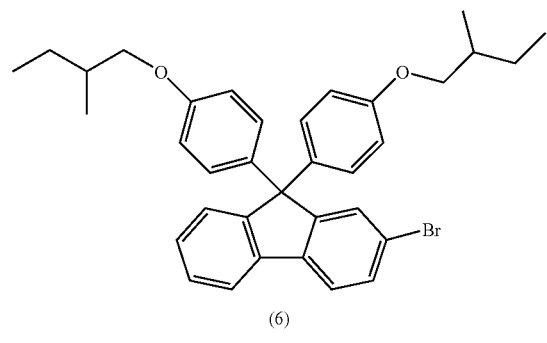
(6)
↓ n-BuLi
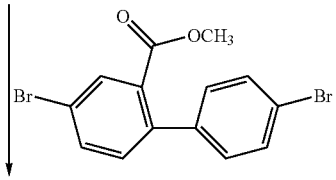
↓
-continued
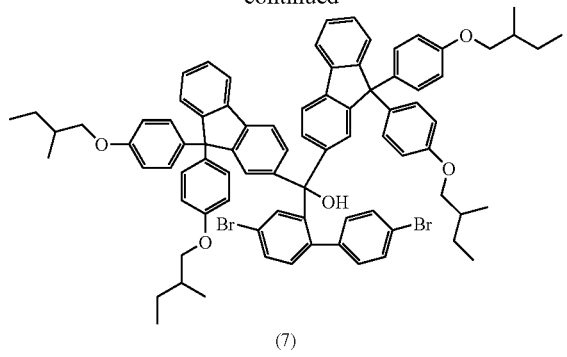
(7)
↓ Actic Acid/H⁺ heat
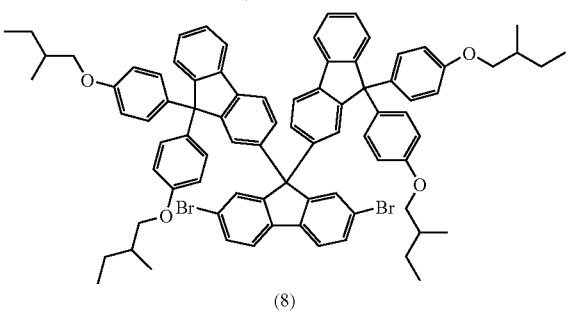
(8)
12 Claims, 4 Drawing Sheets

[Fig. 3]
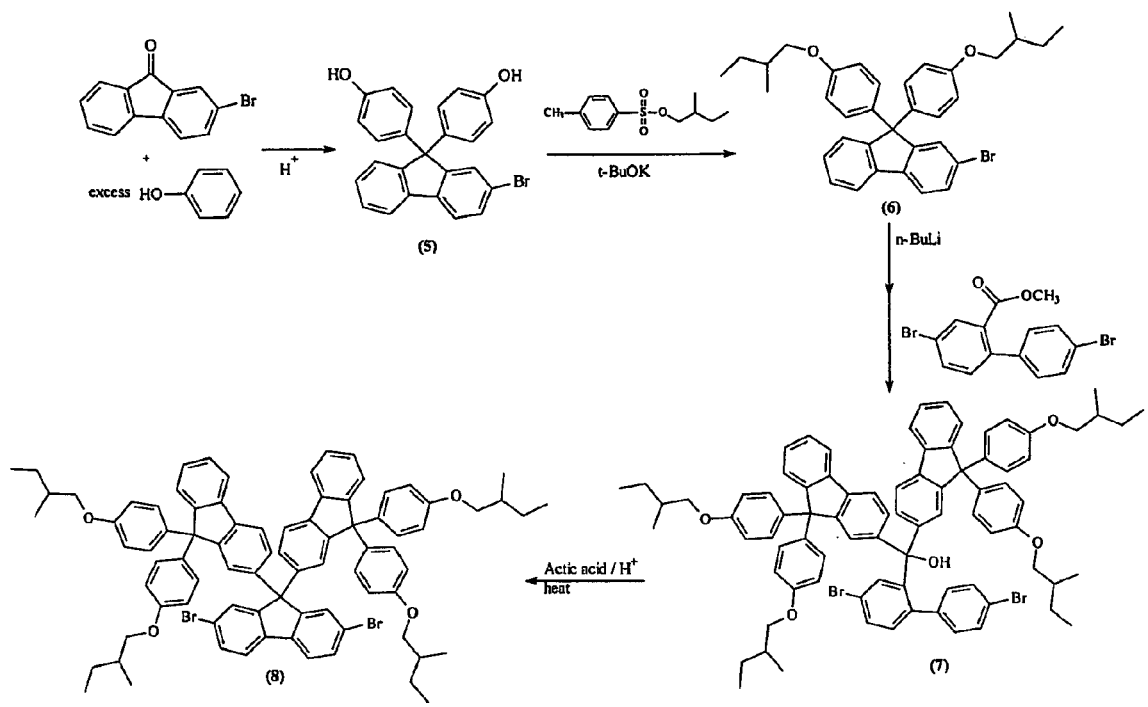
[Fig. 4]
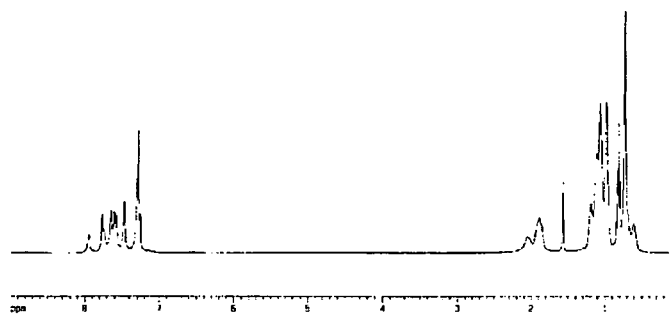
[Fig. 5]
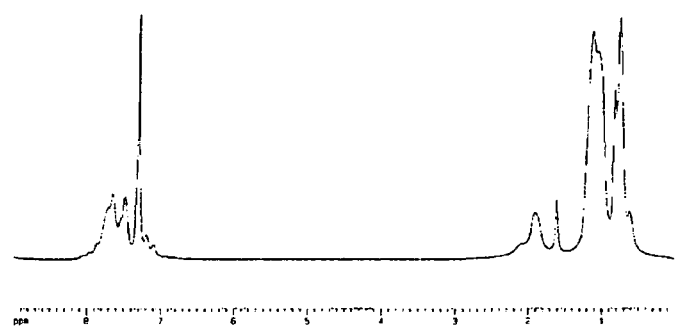

[Fig. 6]
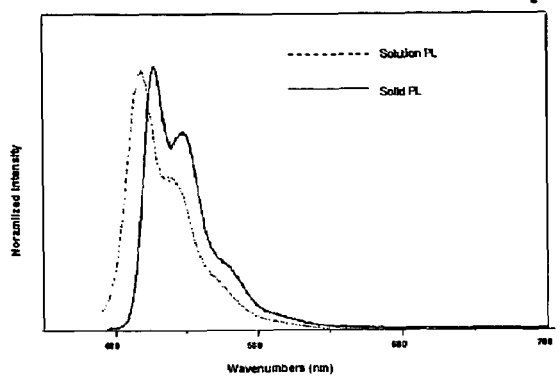
[Fig. 7]
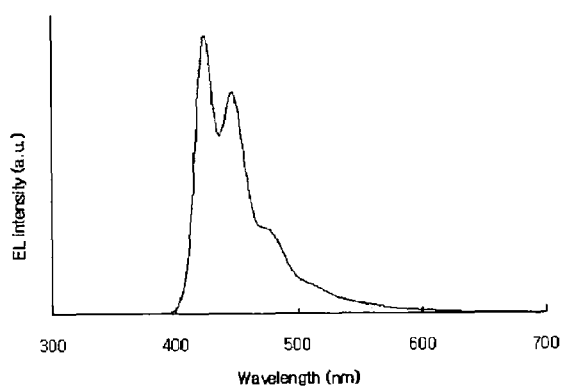
[Fig. 8]
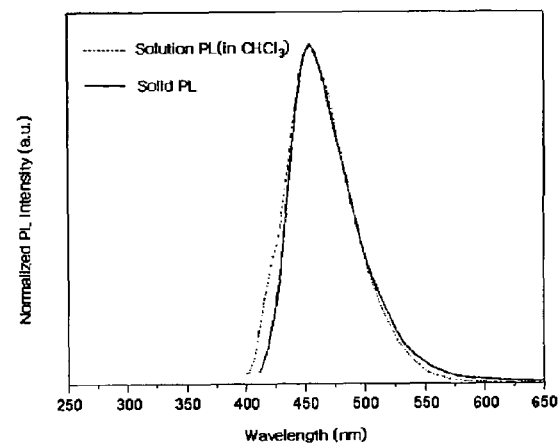
[Fig. 9]
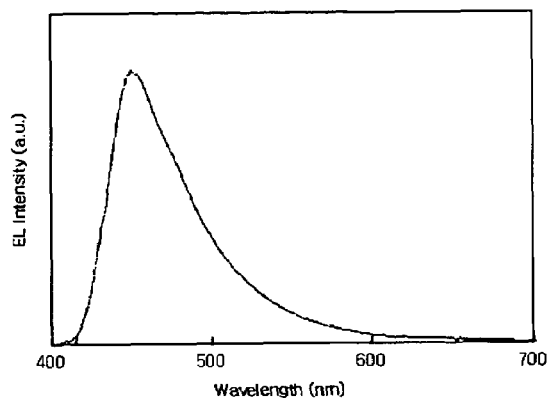

ORGANIC ELECTROLUMINESCENT POLYMER HAVING 9,9-DI(FLUORENYL)-2,7-FLUORENYL UNIT AND ORGANIC ELECTROLUMINESCENT DEVICE MANUFACTURED USING THE SAME

CROSS-REFERENCE TO PRIOR APPLICATION

This is a U.S. National Phase Application under 35 U.S.C. §371 of International Patent Application No. PCT/KR2005/000263 filed Jan. 28, 2005, and claims priority of Korean Patent Application Nos. 10-2005-0007522, filed Jan. 27, 2005 and 10-2004-0006226, filed Jan. 30, 2004, all of which are incorporated by reference herein. The International Application was published in English on Nov. 8, 2005 as WO 2005/073337 A1 under PCT Article 21(2).

TECHNICAL FIELD

The present invention relates to an organic electroluminescent polymer having a 9,9-di(fluorenyl)-2,7-fluorenyl unit and an electroluminescent (EL) device manufactured using the same. More specifically, the present invention relates to an organic electroluminescent polymer having a 9,9-di(fluorenyl)-2,7-fluorenyl unit, which exhibits high heat stability, high light stability, high solubility, excellent film formability and high quantum efficiency, and an organic electroluminescent device manufactured using the organic electroluminescent polymer.

BACKGROUND ART

With recent great improvement in optical communication and multimedia fields, development toward a highly information-intensive society has been accelerated. Accordingly, an optoelectronic device using conversion of a photon into an electron or vice versa has been emphasized in modern information electronic industries.

The semiconductor optoelectronic device is classified into an electroluminescent device, a light receiving device and combinations thereof.

Most displays fabricated up to date are of a light-receiving type, whereas an electroluminescent display has self-luminous characteristics and thus can exhibit a fast response and high luminance, without the need for a backlight. Thus, the electroluminescent display is regarded as a next-generation display.

The electroluminescent device is divided into inorganic luminescent devices and organic luminescent devices, depending on the kind of light emitting layer material.

Organic electroluminescence (EL) means that energy produced when an electron and a hole transferred from a cathode and an anode, respectively, are combined in an organic material by an electric field applied to the organic material is emitted as light. Such electroluminescence of the organic material was reported by Pope et al., 1963. Since a multilayered luminescent device having quantum efficiency of 1% and luminance of 1000 cd/m$^2$ at 10 V or less has been fabricated with the use of a colorant having p-conjugated structure of alumina-quinone, by Tang et al. of Eastmann Kodak, 1987, much research is being conducted. This device is advantageous because various materials can be easily synthesized according to a simple synthesis path, and color tuning is easy. However, processibility or heat stability is low, and also, upon the application of voltage, Joule heat generated from the light emitting layer causes rearrangement of molecules, thus negatively affecting the luminous efficiency or service life of the device. Therefore, an organic electroluminescent device having a polymer structure, capable of alleviating the above problems, is proposed.

In this regard, FIG. 1 shows a conventional organic electroluminescent device including substrate/anode/hole transport layer/light emitting layer/electron transport layer/cathode.

As shown in FIG. 1, an anode 12 is formed on a substrate 11. On the anode 12, a hole transport layer 13, a light emitting layer 14, an electron transport layer 15 and a cathode 16 are sequentially formed. As such, the hole transport layer 13, the light emitting layer 14 and the electron transport layer 15 are an organic thin film made of an organic compound. The organic electroluminescent device having the above structure is actuated as follows:

When voltage is applied to the anode 12 and the cathode 16, the hole injected from the anode 12 is moved to the light emitting layer 14 through the hole transport layer 13. Meanwhile, the electron is injected into the light emitting layer 14 from the cathode 16 through the electron transport layer 15, and the carriers are recombined in the region of the light emitting layer 14, to produce excitons. The excitons are changed from an excited state to a ground state, whereby a fluorescent molecule in the light emitting layer emits light, to form an image.

Organic materials used for the formation of organic films of EL devices may be of low molecular weights or high molecular weights.

Where low-molecular weight organic materials are applied, they can be easily purified to an impurity-free state, and thus is excellent in terms of luminescence properties. However, low-molecular weight materials do not allow inkjet printing or spin coating, and are of poor heat resistance such that they are deteriorated or recrystallized by the heat generated during the operation of the device.

On the other hand, in the case of using high molecular weight materials (i.e., polymer), an energy level is divided into a conduction band and a valance band, as wave functions of p-electrons present in its backbone overlap with each other. The band gap between the conduction band and the valence band defines the semiconductor properties of the polymer and thus, control of the band gap may allow the visualization of full colors. Such a polymer is called a p-conjugated polymer.

The first development of an EL device based on the conjugated polymer poly(p-phenylenevinylene) (hereinafter referred to as 'PPV') by a research team led by Professor R. H. Friend, Cambridge University, England, 1990 has stimulated extensive active research into organic polymers of semiconductor properties. In addition to being superior to low-molecular weight materials in heat resistance, polymeric materials can be applied to large-surface displays by virtue of their ability to be inkjet printed or spin coated. PPV and polythiopene (Pth) derivatives in which various functional moieties are introduced are reported to be improved in processability and exhibit various colors. However, such PPV and Pth derivatives, although applicable for emission of red and green light at high efficiency, have difficulty in emitting blue light at high efficiency. Polyphenylene derivatives and polyfluorene derivatives are reported as blue light-emitting materials. Polyphenylene is of high stability against oxidation and heat, but of poor luminescence efficiency and solubility.

As with the polyfluorene derivatives, the relevant prior arts are as follows:

U.S. Pat. No. 6,255,449 discloses 9-substituted-2,7-dihalofluorene compounds, and oligomers and polymers thereof, which are suitable as luminescent materials, e.g., light emitting or carrier transport layers in light emitting diodes.

U.S. Pat. Nos. 6,309,763 and 6,605,373 disclose an elecroluminescent copolymer containing a fluorine group and an amine group in the repeating unit. According to the '763 patent, such a copolymer is useful as light emitting layer or hole transport layer in the electroluminescent device.

WO 02/77060 discloses a conjugated polymer containing spirobifluorene units. According to this reference, the polymer as disclosed therein shows an improved property profile as electroluminescent material in electronic components such as PLED.

DISCLOSURE OF INVENTION

Technical Problem

As mentioned above, although research into using polyfluorene derivatives as the blue luminescent polymer is being thoroughly carried out, minimization of interactions of excitons produced between neighboring molecules and the improvement of efficiency and service life still remain as tasks to be realized.

Technical Solution

Leading to the present invention, intensive and thorough research on organic electroluminescent polymers carried out by the present inventors aiming to avoid the problems encountered in the prior arts, resulted in the finding that a fluorene unit disubstituted with a substituted fluorenyl group at a 9-position thereof is contained in an electroluminescent polymer, whereby the electroluminescent polymer can be used as a novel host material for blue, green and red luminescence, having excellent heat stability, high luminous efficiency and high solubility while minimizing the interaction of molecules and solving the disadvantages of conventional polyfluorenes (PFs), and an electroluminescent device using the same can be manufactured.

Accordingly, an object of the present invention is to provide an organic electroluminescent polymer as a host material required to realize blue, green and red luminescence, which exhibits high heat and oxidation stability, low interaction of molecules, easy energy transfer, and high luminous efficiency due to suppression of a vibronic mode.

Another object of the present invention is to provide an organic electroluminescent device manufactured using the organic electroluminescent polymer.

In order to accomplish the above objects, the present invention provides an organic electroluminescent polymer having 9,9-di(fluorenyl)-2,7-fluorenyl unit, represented by the following Formula 1:

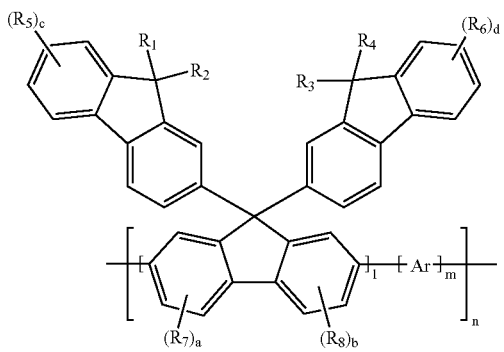

Formula 1 wherein, $R_1$, $R_2$, $R_3$ and $R_4$ are the same or different, each being a linear or branched alkyl group of 1-20 carbons; an aryl group which is unsubstituted or substituted with at least one substituent group selected from the group consisting of linear or branched alkyl and alkoxy groups of 1-20 carbons; a linear or branched alkyl group of 1-20 carbons having at least one hetero-atom selected from the group consisting of F, S, N, O, P and Si; an aryl group which is substituted with at least one substituent group selected from the group consisting of linear or branched alkyl and alkoxy groups of 1-20 carbons containing at least one hetero-atom selected from the group consisting of F, S, N, O, P and Si; an aryl group having a heterocyclic moiety of 2-24 carbons which is unsubstituted or substituted with at least one substituent group selected from the group consisting of linear or branched alkyl and alkoxy groups of 1-20 carbons; an aryl group having a heterocyclic moiety of 2-24 carbons which is substituted with at least one substituent group selected from the group consisting of linear or branched alkyl and alkoxy groups of 1-20 carbons containing at least one hetero-atom selected from the group consisting of F, S, N, O, P and Si; a substituted or unsubstituted trialkylsilyl group of 3-40 carbons; a substituted or unsubstituted arylsilyl group of 3-40 carbons; a substituted or unsubstituted carbazole group of 12-60 carbons; a substituted or unsubstituted phenothiazine group of 6-60 carbons; or a substituted or unsubstituted arylamine group of 6-60 carbons;

$R_5$, $R_6$, $R_7$ and $R_8$ are the same or different, each being hydrogen; a linear or branched alkyl or alkoxy group of 1-20 carbons; an aryl group which is unsubstituted or substituted with at least one substituent group selected from the group consisting of linear or branched alkyl and alkoxy groups of 1-20 carbons; a linear or branched alkyl or alkoxy group of 1-20 carbons having at least one hetero-atom selected from the group consisting of F, S, N, O, P and Si; an aryl group which is substituted with at least one substituent group selected from the group consisting of linear or branched alkyl and alkoxy groups of 1-20 carbons containing at least one hetero-atom selected from the group consisting of F, S, N, O, P and Si; an aryl group having a heterocyclic moiety of 2-24 carbons which is unsubstituted or substituted with at least one substituent group selected from the group consisting of linear or branched alkyl and alkoxy groups of 1-20 carbons; an aryl group having a heterocyclic moiety of 2-24 carbons which is substituted with at least one substituent group selected from the group consisting of linear or branched alkyl and alkoxy groups of 1-20 carbons containing at least one hetero-atom selected from the group consisting of F, S, N, O, P and Si; a substituted or unsubstituted trialkylsilyl group of 3-40 carbons; a substituted or unsubstituted arylsilyl group of 3-40 carbons; a substituted or unsubstituted carbazole group of 12-60 carbons; a substituted or unsubstituted phenothiazine group of 6-60 carbons; or a substituted or unsubstituted arylamine group of 6-60 carbons;

a, b, c and d are the same or different, each being an integer of 1-3;

Ar is selected from the group consisting of a substituted or unsubstituted aromatic moiety of 6-60 carbons, a substituted or unsubstituted heteroaromatic moiety of 2-60 carbons, and combinations thereof; and l is an integer of 1-100,000, m is an integer of 0-100,000, and n is an integer of 1-100,000.

Further, the present invention provides an organic electroluminescent device having at least one layer comprising the polymer as described above between an anode and a cathode, wherein, the layer is a hole-transport layer, a light emitting layer, an electron-transport layer or a hole blocking layer.

Advantageous Effects

The present invention provides an organic electroluminescent polymer having a 9,9-di(fluorenyl)-2,7-fluorenyl unit and an organic electroluminescent device manufactured using the same. The electroluminescent polymer of the present invention has superior heat stability, high luminous efficiency and high solubility, and serves to minimize the interaction of molecules. Further, the above polymer can alleviate the disadvantages of conventional polyfluorene-based polymers, and be used as a host material for blue, green and red luminescence of the electroluminescent device, thus exhibiting superior luminous characteristics.

DESCRIPTION OF DRAWINGS

The above and other objects, features and other advantages of the present invention will be more clearly understood from the following detailed description taken in conjunction with the accompanying drawings, in which:

FIG. 3 is a view schematically showing a monomer synthesis reaction of an electroluminescent polymer represented by Formula 4, according to the present invention;

FIG. 4 is an $^1$H-NMR spectrum of a monomer represented by a compound (2), according to the present invention;

FIG. 5 is an $^1$H-NMR spectrum of the electroluminescent polymer represented by Formula 2, according to the present invention;

FIG. 6 is a photoluminescence (PL) spectrum of the electroluminescent polymer represented by Formula 2 in a chloroform solution and a film, respectively, according to the present invention;

FIG. 7 is an electroluminescence (EL) spectrum of an electroluminescent device manufactured using the electroluminescent polymer represented by Formula 2, according to the present invention;

FIG. 8 is a photoluminescence (PL) spectrum of the electroluminescent polymer represented by Formula 4 in a chloroform solution and a film, respectively, according to the present invention; and FIG. 9 is an electroluminescence (EL) spectrum of an electroluminescent device manufactured using the electroluminescent polymer represented by Formula 4, according to the present invention.

BEST MODE

Figure 1:
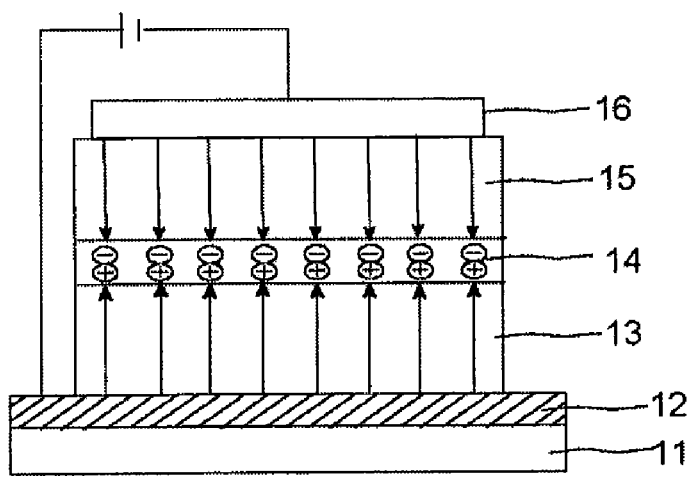
FIG. 1 is a schematic cross-sectional view showing a structure of a conventional organic electroluminescent device including substrate/anode/hole transport layer/light emitting layer/electron transport layer/cathode.

Hereinafter, a detailed description will be given of the present invention, with reference to the accompanying drawings.

The present invention provides an organic electroluminescent polymer containing 9,9-di(fluorenyl)-2,7-fluorenyl unit, which is usable as a host material of highly pure blue, green and red luminescence while having high solubility, high heat stability and high quantum efficiency, and an electroluminescent device manufactured using the same.

The organic electroluminescent polymer of the present invention, which is a material having high heat stability, high light stability, high solubility, high quantum efficiency and excellent film formability, is characterized in that a fluorenyl group, which is a bulky substituent, is introduced at a 9-position of fluorene as a main chain, whereby the substituent has the same structure as the main chain. Therefore, the arrangement between the main chain and the substituent becomes random, and also, intermolecular excimer formation by the substituent is inhibited, thus preventing aggregation and/or excimer formation which are the biggest problems encountered in the polyfluorene-based polymer. Moreover, intramolecular or intermolecular energy transfer to the main chain from the substituent having a short wavelength can be realized.

Further, the 9-position of fluorene used as the main chain serves to control rotation and vibronic modes using the bulky fluorenyl substituent to drastically reduce non-radiative decay. Therefore, the organic electroluminescent polymer of the present invention exhibits high color purity, high luminance and high efficiency.

According to the present invention, the organic electroluminescent polymer having 9,9-di(fluorenyl)-2,7-fluorenyl unit is represented by the following Formula 1:

Formula 1

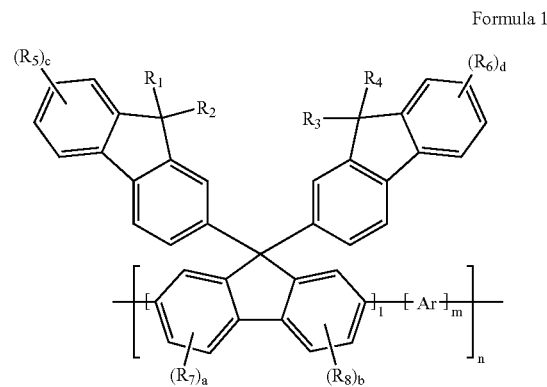

wherein, $R_1$, $R_2$, $R_3$ and $R_4$ are the same or different, each being a linear or branched alkyl group of 1-20 carbons; an aryl group which is unsubstituted or substituted with at least one substituent group selected from the group consisting of linear or branched alkyl and alkoxy groups of 1-20 carbons; a linear or branched alkyl group of 1-20 carbons having at least one hetero-atom selected from the group consisting of F, S, N, O, P and Si; an aryl group which is substituted with at least one substituent group selected from the group consisting of linear or branched alkyl and alkoxy groups of 1-20 carbons containing at least one hetero-atom selected from the group consisting of F, S, N, O, P and Si; an aryl group having a heterocyclic moiety of 2-24 carbons which is unsubstituted or substituted with at least one substituent group selected from the group consisting of linear or branched alkyl and alkoxy groups of 1-20 carbons; an aryl group having a heterocyclic moiety of 2-24 carbons which is substituted with at least one substituent group selected from the group consisting of linear or branched alkyl and alkoxy groups of 1-20 carbons containing at least one hetero-atom selected from the group consisting of F, S, N, O, P and Si; a substituted or unsubstituted trialkylsilyl group of 3-40 carbons; a substituted or unsubstituted arylsilyl group of 3-40 carbons; a substituted or unsubstituted carbazole group of 12-60 carbons; a substituted or unsubstituted phenothiazine group of 6-60 carbons; or a substituted or unsubstituted arylamine group of 6-60 carbons;

$R_5$, $R_6$, $R_7$ and $R_8$ are the same or different, each being hydrogen; a linear or branched alkyl or alkoxy group of 1-20 carbons; an aryl group which is unsubstituted or substituted with at least one substituent group selected from the group consisting of linear or branched alkyl and alkoxy groups of 1-20 carbons; a linear or branched alkyl or alkoxy group of 1-20 carbons having at least one hetero-atom selected from the group consisting of F, S, N, O, P and Si; an aryl group which is substituted with at least one substituent group selected from the group consisting of linear or branched alkyl and alkoxy groups of 1-20 carbons containing at least one hetero-atom selected from the group consisting of F, S, N, O, P and Si; an aryl group having a heterocyclic moiety of 2-24 carbons which is unsubstituted or substituted with at least one substituent group selected from the group consisting of linear or branched alkyl and alkoxy groups of 1-20 carbons; an aryl group having a heterocyclic moiety of 2-24 carbons which is substituted with at least one substituent group selected from the group consisting of linear or branched alkyl and alkoxy groups of 1-20 carbons containing at least one hetero-atom selected from the group consisting of F, S, N, O, P and Si; a substituted or unsubstituted trialkylsilyl group of 3-40 carbons; a substituted or unsubstituted arylsilyl group of 3-40 carbons; a substituted or unsubstituted carbazole group of 12-60 carbons; a substituted or unsubstituted phenothiazine group of 6-60 carbons; or a substituted or unsubstituted arylamine group of 6-60 carbons;

a, b, c and d are the same or different, each being an integer of 1-3;

Ar is selected from the group consisting of a substituted or unsubstituted aromatic moiety of 6-60 carbons, a substituted or unsubstituted heteroaromatic moiety of 2-60 carbons, and combinations thereof; and l is an integer of 1-100,000, m is an integer of 0-100,000, and n is an integer of 1-100,000. Preferably, the ratio of l:m ranges from 5:95 to 95:5.

In accordance with the present invention, it is preferred that $R_1$, $R_2$, $R_3$ and $R_4$, respectively are selected from the following group:

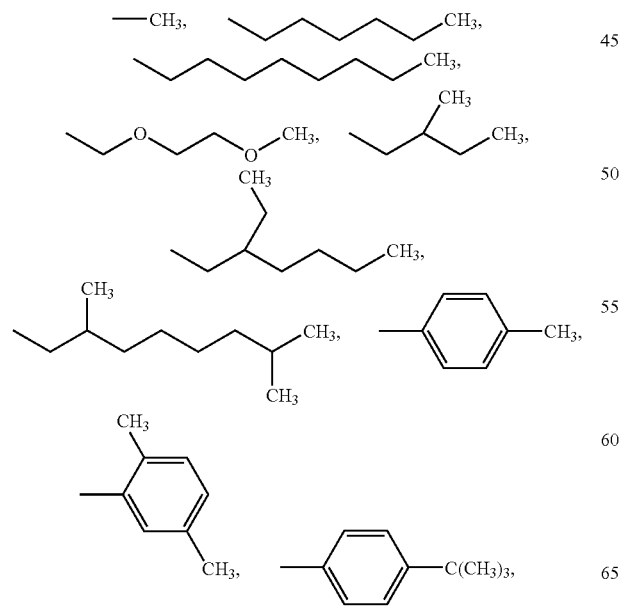

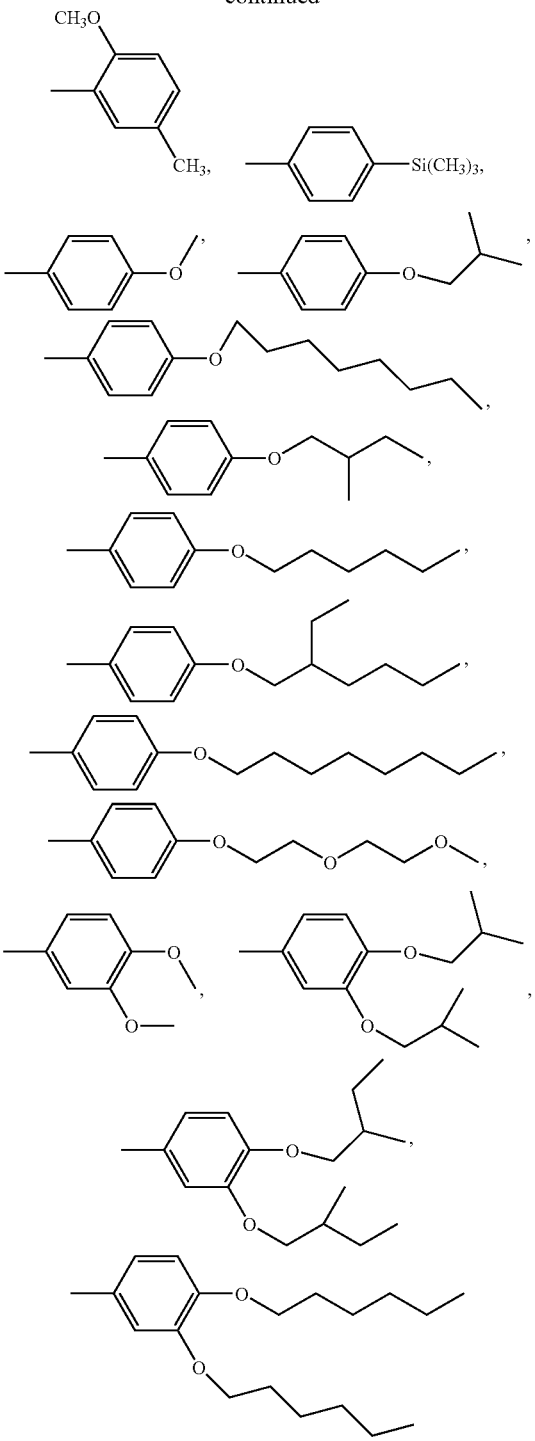

Further, it is preferred that $R_5$ and $R_6$, respectively are selected from the following group:

hydrogen,

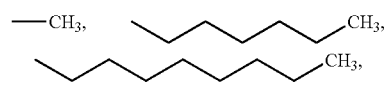

-continued
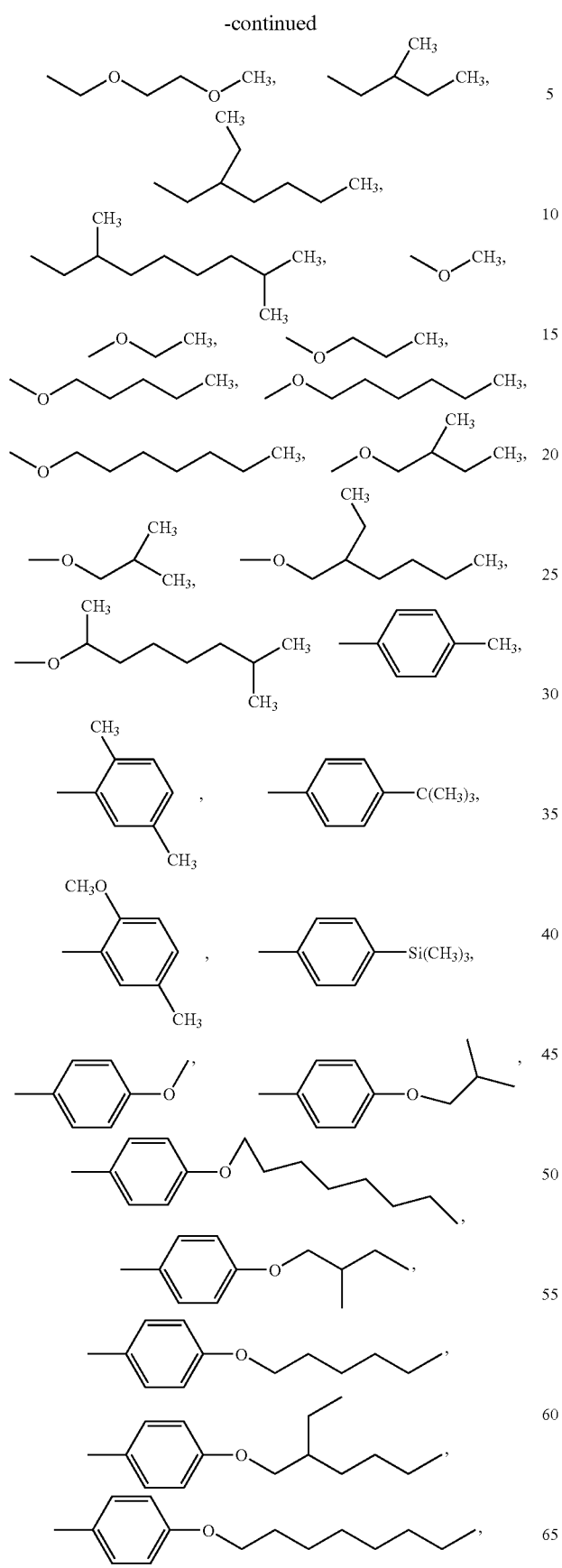
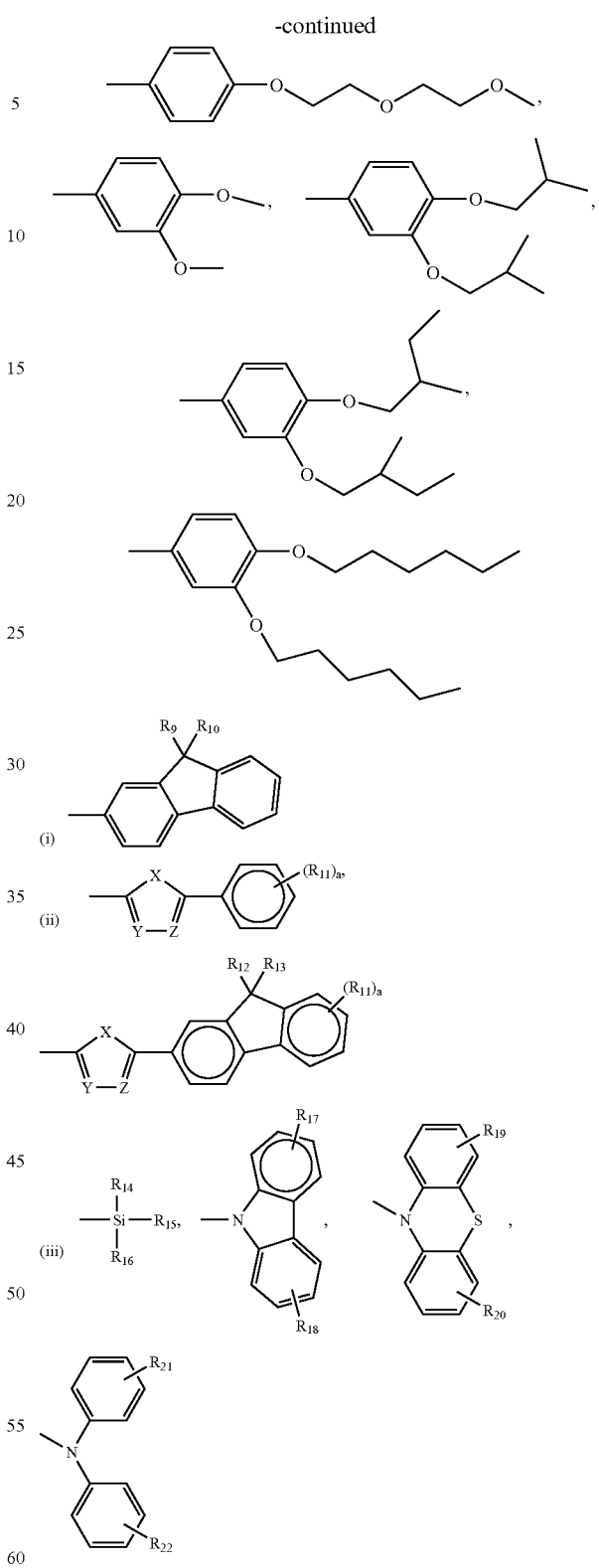
wherein
(i) $R_9$ and $R_{10}$ are the same or different, and respectively are a linear or branched alkyl group of 1-20 carbons.
The above fluorenyl may be representatively selected from the following group:

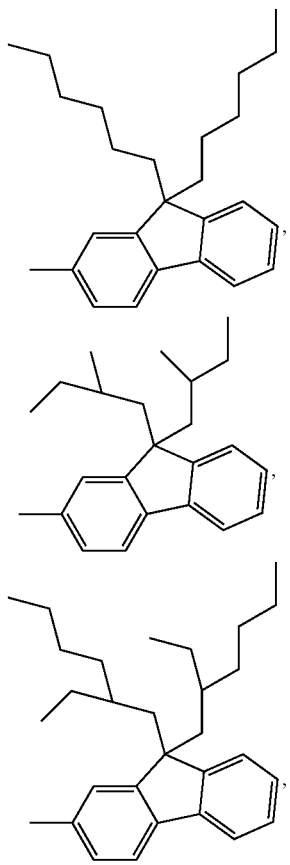

(ii) $R_{11}$ is hydrogen or a linear or branched alkyl, alkoxy or trialkylsilyl group of 1-20 carbons;

$R_{12}$ and $R_{13}$ are the same or different, and respectively are a linear or branched alkyl group of 1-20 carbons;

X is O or S;

Y and Z are N; and a is an integer of 1-3.

The above aryl having a heterocyclic moiety may be representatively selected from the following group:

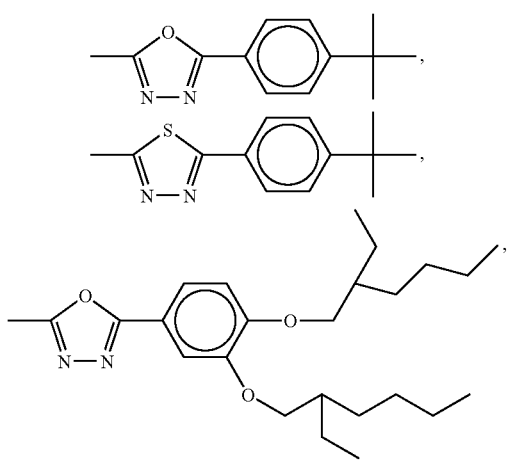

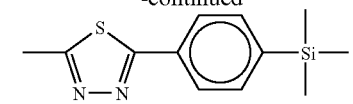

(iii) $R_{14}$, $R_{15}$ and $R_{16}$ are the same or different, and respectively are a linear or branched alkyl or alkoxy group of 1-20 carbons; or an aryl group which is unsubstituted or substituted with at least one substituent group selected from the group consisting of linear or branched alkyl and alkoxy groups of 1-20 carbons; and $R_{17}$, $R_{18}$, $R_{19}$, $R_{20}$, $R_{21}$ and $R_{22}$ are the same or different, and respectively are hydrogen; a linear or branched alkyl or alkoxy group of 1-20 carbons; or an aryl group which is unsubstituted or substituted with at least one substituent group selected from the group consisting of linear or branched alkyl and alkoxy groups of 1-20 carbons.

The above silyl, carbazole, phenothiazine and arylamine may be representatively selected from the following group:

-continued

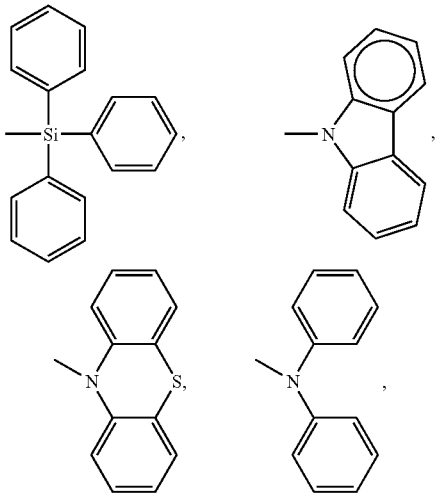

In addition, it is preferred that $R_7$ and $R_8$, respectively are selected from the following group:
hydrogen,

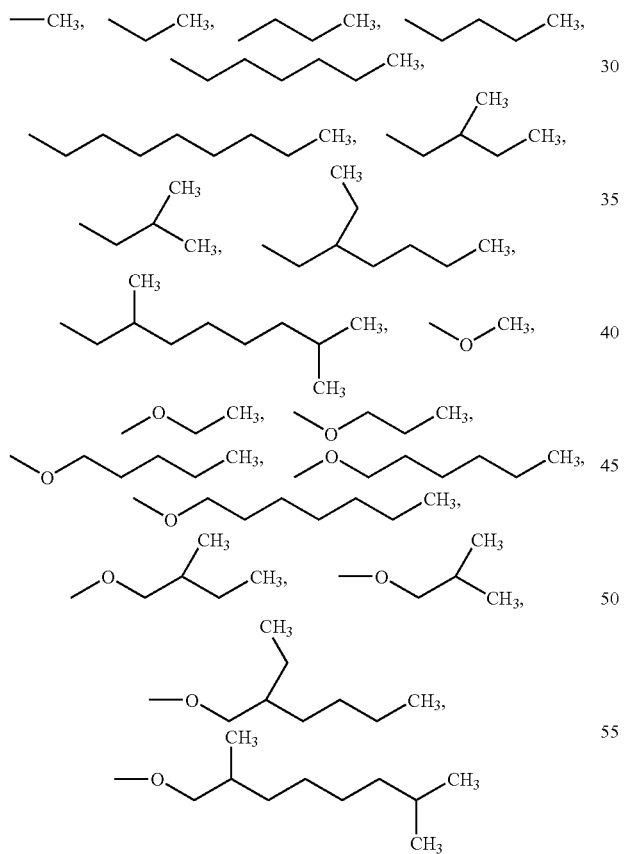

In accordance with the present invention, it is preferred that Ar is selected from the following group: (i) a substituted or unsubstituted arylene group of 6-60 carbons, (ii) a substituted or unsubstituted heterocyclic arylene group of 2-60 carbons in which at least one hetero-atom selected from the group consisting of N, S, O, P and Si is incorporated in an aromatic ring, (iii) a substituted or unsubstituted arylenevinylene group of 6-60 carbons, (iv) a substituted or unsubstituted arylamine group of 6-60 carbons, (v) a substituted or unsubstituted carbazole group of 12-60 carbons, and (vi) combinations thereof, in which Ar may include a substituent, such as a linear or branched alkyl or alkoxy group of 1-20 carbons, an aryl group which is unsubstituted or substituted with at least one substituent group selected from the group consisting of linear or branched alkyl and alkoxy groups of 1-20 carbons, a cyano group (—CN), or a silyl group.

More specifically, (i) when Ar is the phenylene group or the fluorenylene group, among the substituted or unsubstituted arylene group of 6-60 carbons, it may be representatively selected from the following group:

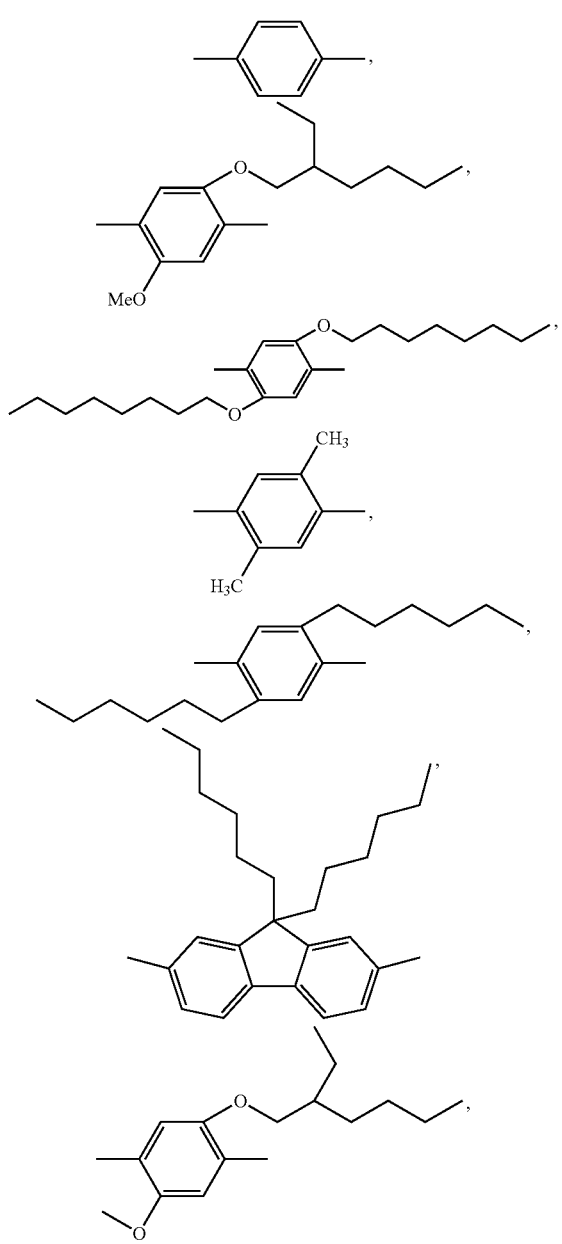

-continued
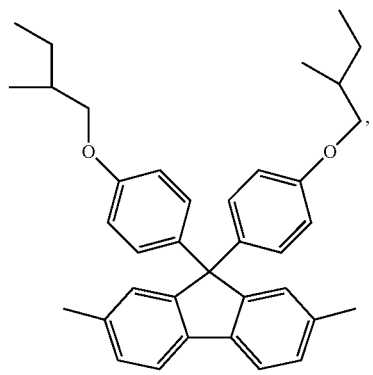
(ii) when Ar is the substituted or unsubstituted heterocyclic arylene group of 2-60 carbons, it may be representatively selected from the following group:
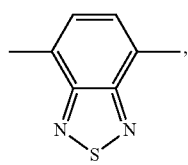
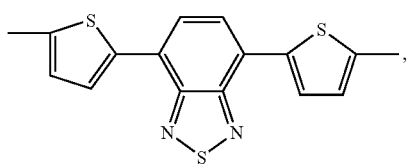
(iii) when Ar is the substituted or unsubstituted arylenevinylene group of 6-60 carbons, it may be representatively selected from the following group:
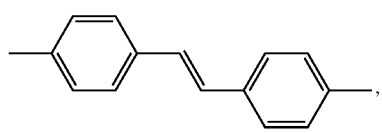
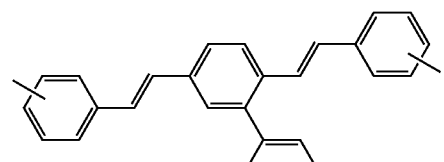
-continued
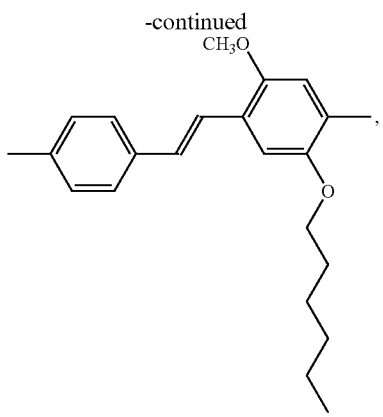
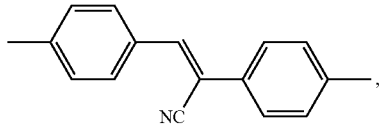
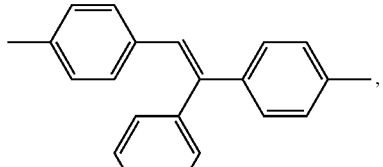
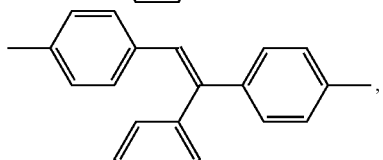
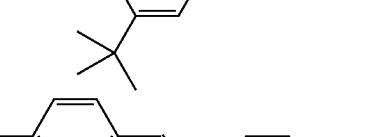
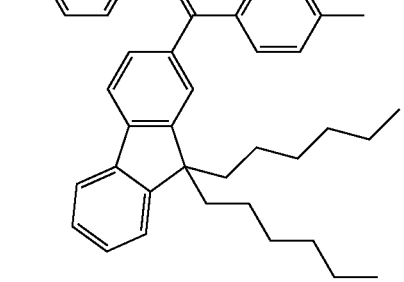
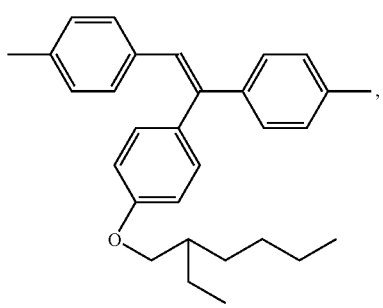

(iv) when Ar is the substituted or unsubstituted arylamine group of 6-60 carbons, it may be representatively selected from the following group:

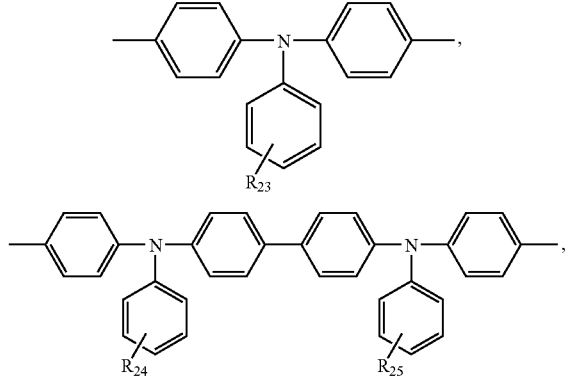

wherein, $R_{23}$, $R_{24}$ and $R_{25}$ are the same or different, and are hydrogen; a linear or branched alkyl or alkoxy group of 1-20 carbons; or an aryl group which is unsubstituted or substituted with at least one substituent group selected from the group consisting of linear or branched alkyl and alkoxy groups of 1-20 carbons. More preferably, Ar is selected from the following group:

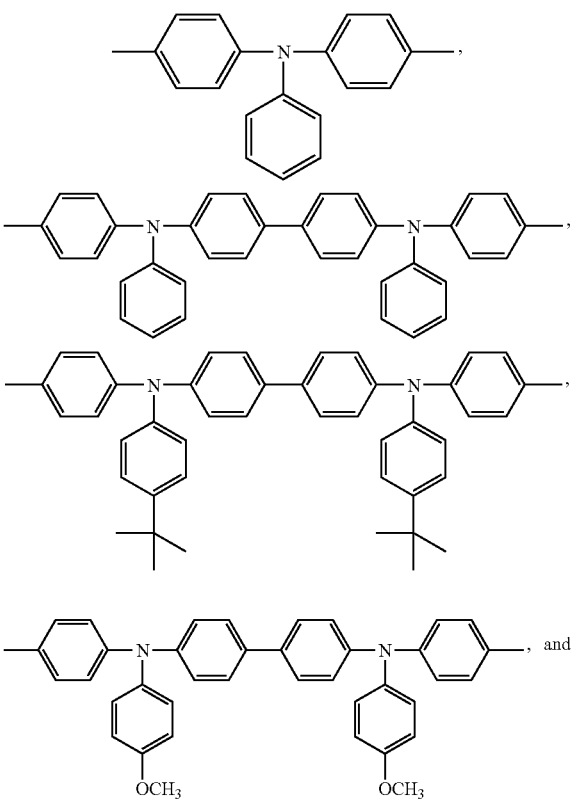

(v) when Ar is the substituted or unsubstituted carbazole group of 12-60 carbons, it may be representatively selected from the following group:

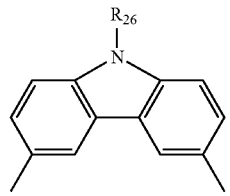

wherein, $R_{26}$ is a linear or branched alkyl or alkoxy group of 1-20 carbons; or an aryl group which is unsubstituted or substituted with at least one substituent group selected from the group consisting of linear or branched alkyl and alkoxy groups of 1-20 carbons.

Further, when Ar is (iv) the substituted or unsubstituted arylamine group of 6-60 carbons, it is preferably present in an amount of about 5-15 mol % in the electroluminescent polymer.

The preparation of the organic electroluminescent polymer of the present invention includes, for example, preparing monomers through alkylation, bromization, Grignard reaction, Wittig reaction, etc., and then preparing organic electroluminescent polymers through a C—C coupling reaction such as Yamamoto coupling reaction or Suzuki coupling reaction. The resultant polymers have a number average molecular weight of 1,500-10,000,000, and a molecular weight distribution of 1-50.

The organic electroluminescent polymer of the present invention can be applied as a host of blue, green and red luminescence, which is excellent in terms of heat stability, oxidation stability and solubility, and exhibits low interaction of molecules, easy energy transfer, and high luminous efficiency due to the suppression of vibronic mode.

According to the present invention, the organic electroluminescent polymer may be used as a material for forming a light emitting layer, a hole transport layer, an electron transport layer or a hole blocking layer, disposed between one pair of electrodes in the electroluminescent device.

The organic electroluminescent device includes a basic structure of anode/emitting layer/cathode, and optionally, further has the hole transport layer and the electron transport layer.

Referring to FIG. 1 which is a sectional view showing a typical structure of the organic electroluminescent device having substrate/anode/hole transport layer/light emitting layer/electron transport layer/cathode, the organic electroluminescent device is, for example, fabricated using the organic electroluminescent polymer of the present invention as follows:

An electrode material of anode 12 is coated on a substrate 11.

As the substrate 11, any substrate used for the conventional organic electroluminescent device is employed. Preferably, a glass substrate or a transparent plastic substrate having excellent transparency, surface flatness, easy handling and water resistance is useful.

Further, the electrode material of anode 12 includes indium tin oxide (ITO), tin oxide ($SnO_2$), zinc oxide (ZnO), which are transparent and highly conductive.

Subsequently, a hole transport layer 13 may be formed on the anode 12 through vacuum deposition or sputtering, after which a light emitting layer 14 is formed through a solution coating process such as spin coating or inkjet printing. Also, an electron transport layer 15 is formed on the light emitting layer 14, before forming a cathode 16. As such, the light emitting layer 14 has a thickness ranging from about 5 nm to about 1 mm, preferably, from about 10 to about 500 nm. The hole transport layer and the electron transport layer are about 10-10000 Å thick.

The electron transport layer 15 is obtained by using the conventional electron transport layer forming material or by subjecting the compound represented by Formula 1 to vacuum deposition, sputtering, spin coating or inkjet printing.

The hole transport layer 13 and the electron transport layer 15 function to efficiently transfer carriers to the luminescent polymer, thereby increasing luminous efficiency in the luminescent polymer. Further, the forming material of the hole transport layer 13 and the electron transport layer 15 is not particularly limited. For example, the hole transport layer material includes PEDOT:PSS as poly(3,4-ethylenedioxythiophene) (PEDOT) doped with (poly(styrenesulfonic acid) (PSS) layer, and N,N'-bis(3-methylphenyl)-N,N-diphenyl-[1,1'-biphenyl]-4,4'-diamine (TPD), while the electron transport material includes aluminum trihydroxyquinoline (Alq3), 1,3,4-oxadiazole derivative PBD (2-(4-biphenylyl)-5-phenyl-1,3,4-oxadiazole, quinoxaline derivative TPQ (1,3,4-tris[(3-penyl-6-trifluoromethyl)quinoxaline-2-yl]benzene) and triazole derivative.

In cases where the organic electroluminescent polymer is subjected to solution coating to form the layer, it may be blended with a polymer having conjugated double bonds such as polyphenylenevinylene and polyparaphenylene, as well as other fluorene based polymers. As necessary, binder resins may be mixed for use. The binder resin is exemplified by polyvinylcarbazole, polycarbonate, polyester, polyarylate, polystyrene, acryl polymer, methacryl polymer, polybutyral, polyvinylacetal, diallylphthalate polymer, phenol resin, epoxy resin, silicone resin, polysulfone resin or urea resin. The resins may be used alone or in combinations thereof.

Optionally, a hole blocking layer made of LiF (lithium fluoride) is further formed, for example through vacuum deposition so as to function to control a transfer rate of the hole in the light emitting layer 14 and increase combination efficiency between an electron and a hole.

Finally, an electrode material of a cathode 16 is coated on the electron transport layer 15.

The metal for forming the cathode of low work function includes, for example, lithium (Li), magnesium (Mg), calcium (Ca), aluminum (Al), and Al:Li.

The organic electroluminescent device of the present invention is fabricated to have the sequence of anode/hole transport layer/light emitting layer/electron transport layer/cathode or vice versa, that is, cathode/electron transport layer/light emitting layer/hole transport layer/anode.

In addition, the organic electroluminescent polymer is applied not only as the high-molecular weight organic electroluminescent device material, but also as a light conversion material for a light diode or a semiconductor material for a polymer TFT (Thin Film Transistor).

According to the present invention, the organic electroluminescent polymer has the fluorenyl group, which is a bulky substituent, introduced at the 9-position of fluorene as the main chain. Thus, the substituent has the same structure as the main chain, whereby the random arrangement between the main chain and the substituent occurs. Further, intermolecular excimer formation by the substituent can be inhibited, thus preventing aggregation and/or excimer formation, which are regarded as the biggest problems in the field of polyfluorenes. Also, intramolecular or intermolecular energy transfer from the substituent having a short wavelength to the main chain can be realized. By the substituted fluorenyl group introduced at the 9-position of the fluorene group as the main chain, rotation and vibronic modes are controlled, hence dramatically reducing nonradiative decay to exhibit high heat stability, light stability, solubility, film formability and quantum efficiency. Therefore, the organic electroluminescent polymer of the present invention and the organic electroluminescent device manufactured using the same can exhibit excellent color purity and luminance, and high efficiency.

Mode for Invention

A better understanding of the present invention may be obtained in light of the following examples which are set forth to illustrate, but are not to be construed to limit the present invention.

Figure 2:
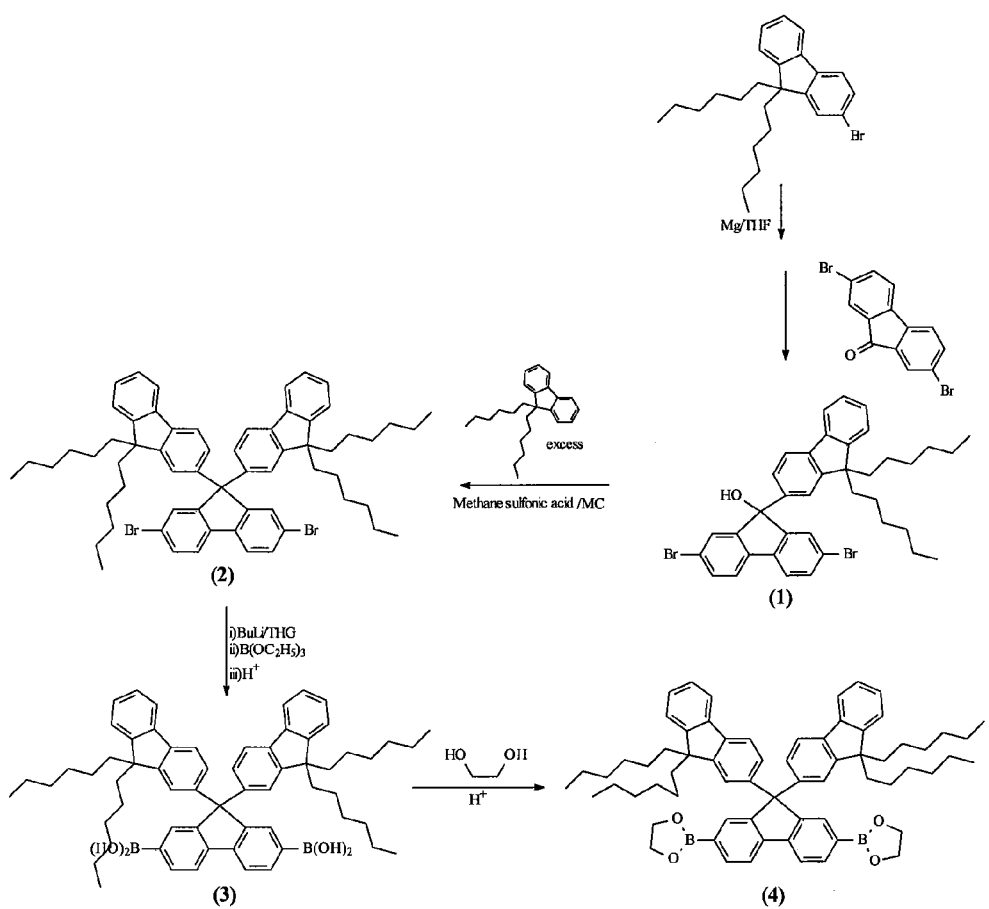
FIG. 2 is a view schematically showing a monomer synthesis reaction of an electroluminescent polymer represented by Formula 2, according to the present invention.

The following Examples 1-4 were performed according to the reaction shown in FIG. 2.

EXAMPLE 1

Synthesis of (9-(9,9-dihexylfluoren-2-yl)-2,7-dibromofluoren-9-ol) (1)

To 5.64 g of Mg placed into a 1000 ml three-neck flask, 80 g of 9,9-dihexyl-2-bromofluorene in 300 ml THF was slowly added dropwise, to prepare a Grignard reagent. After a temperature of a reaction chamber was decreased to −40° C. or less, 52 g of 2,7-dibromofluorenone was added to the reaction bath in a nitrogen atmosphere. The temperature was gradually increased to room temperature, followed by stirring for 10 hours. The resulting reaction solution was poured into water, after which an extraction was performed using diethyl ether. The solvent was evaporated using a rotary evaporator. A column chromatography separation resulted in 60 g (58%) of (9-(9,9-dihexylfluoren-2-yl)-2,7-dibromofluoren-9-ol) (1).

EXAMPLE 2

Synthesis of (9,9-di(9,9-dihexylfluoren-2-yl)-2,7-dibromofluorene) (2)

In a 2 L round-bottom flask, 50 g of the compound (1) and 200 g of 9,9-dihexylfluorene were dissolved in 1000 ml of dichloromethane, and then the temperature was decreased to 0° C. The reaction solution was slowly added with a solution of 10 ml of methane sulfonic acid dissolved in 100 ml of dichloromethane with stirring, followed by further stirring for 2 hours. The resulting reaction solution was poured into water, after which an extraction was performed using diethyl ether. The solvent was evaporated using a rotary evaporator. A column chromatography separation resulted in 60 g (58%) of (9,9-di(9,9-dihexylfluoren-2-yl)-2,7-dibromofluorene) (2).

EXAMPLE 3

Synthesis of (9,9-di(9,9-dihexylfluoren-2-yl)fluorene-2,7-diboronic acid) (3)

In a 250 ml round-bottom flask, 10 g of the compound (2) was dissolved in 60 ml of THF, and then the temperature was decreased to −70° C. 2 equivalents of 2.5 M n-butyllithium were slowly added to the above reaction solution, and the reaction occurred at a low temperature (−70° C. to −40° C.) for 2 hours. Also, 4 equivalents of triethyl borate were added at the same temperature and the obtained reaction solution was allowed to stand for 12 hours. The resultant reaction solution was added to 3 N HCl aqueous solution, followed by stirring for 4 hours and extraction with diethyl ether. The solvent was removed using a rotary evaporator, to obtain a solidified material, which was then washed several times with toluene, to yield 3.6 g (39%) of (9,9-di(9,9-dihexylfluoren-2-yl)fluorene-2,7-diboronic acid) (3).

EXAMPLE 4

Synthesis of (9,9-di(9,9-dihexylfluoren-2-yl)fluorene-2,7-bisboronic glycol ester) (4)

2 g of the compound (3), 3 equivalents of ethylene glycol and 50 ml of anhydrous toluene were placed into a 100 ml round-bottom flask, which was fitted with a deanstark device. Subsequently, a refluxing was performed for 24 hours to remove water. The obtained material was recrystallized in toluene, to yield 1.8 g of (9,9-di(9,9-dihexylfluoren-2-yl)fluorene-2,7-bisboronic glycol ester) (4).

The following Examples 5-8 were carried out according to the reaction scheme shown in FIG. 3.

EXAMPLE 5

Synthesis of (2-bromo-9,9-di(4-hydroxyphenyl)fluorene) (5)

10 g of 2-bromofluorene, 2 equivalents of methane sulfonic acid and 100 g of phenol were placed into a 500 ml round-bottom flask, followed by stirring at 150° C. for 24 hours. The reaction solution was cooled and then mixed with water to filter solids. The solids were then recrystallized in toluene, to yield 12 g of (2-bromo-9,9-di(4-hydroxyphenyl)fluorene) (5).

EXAMPLE 6

Synthesis of (2-bromo-9,9-di(4-(2-methyl)butyloxy)phenyl)fluorene) (6)

In a 250 ml round-bottom flask, 10 g of the compound (5) and 2.2 equivalents of 2-methyl butyl p-toluene sulfonate were dissolved in 100 ml of DMSO, to obtain a reaction solution, to which 2.3 equivalents of potassium t-butoxide (t-BuOK) was slowly added. The reaction took place at 70° C. for 12 hours. The resulting reaction solution was poured into 500 ml of water, followed by extraction with methylene chloride and removal of the solvent using a rotary evaporator. A column chromatography separation using a mixture solvent of hexane and ethylacetate resulted in 14 g of (2-bromo-9,9-di(4-(2-methyl)butyloxy)phenyl)fluorene) (6).

EXAMPLE 7

Synthesis of (4,4-dibromobiphen-2-yl-di[9,9-bis(4-(2-methyl)butyloxy)phenyl]fluoren-2-yl-methanol) (7)

In a 250 ml three-neck flask, 18 g of the compound (6) was dissolved in 300 ml of THF, and then the reactor was cooled to −40° C., to which 2.5 M n-butyl lithium was slowly added dropwise, followed by stirring for 2 hours. The temperature of the reaction bath was decreased to −40° C. or less, and 0.4 equivalents of methyl-(2-bromo-4-bromophenyl)benzoate was added to the reaction bath in a nitrogen atmosphere, and the temperature was gradually increased to room temperature, followed by stirring for 10 hours. The reaction solution was poured into water, followed by extraction with diethyl ether. The solvent was removed using a rotary evaporator. By a column chromatography separation, 17 g of (4,4-dibromo-biphen-2-yl-di[9,9-bis(4-(2-methyl)butyloxy)phenyl]fluoren-2-yl-methanol) (7) was obtained.

EXAMPLE 8

Synthesis of (2,7-dibromo-[9,9-bis[9,9-di(4-(2-methyl)butyloxyphenyl)fluoren-2-yl]fluorene]) (8)

10 g of the compound (7) and 100 ml of acetic acid were placed into a 250 ml round-bottom flask, to which 5 droplets of 35 wt % hydrochloric acid were added, followed by refluxing for 12 hours. The temperature of the reaction solution was decreased to room temperature to filter solids. The filtered solids were then washed with a mixture of water and methanol, and recrystallized in a mixture solution of methyl chloride and ethanol, to yield (2,7-dibromo-[9,9-bis[9,9-di(4-(2-methyl)butyloxyphenyl)fluoren-2-yl]fluorene]) (8) as white solids.

EXAMPLE 9

Synthesis of Poly(9,9-di(9,9-dihexylfluoren-2-yl)-2,7-fluorenyl) (Formula 2)

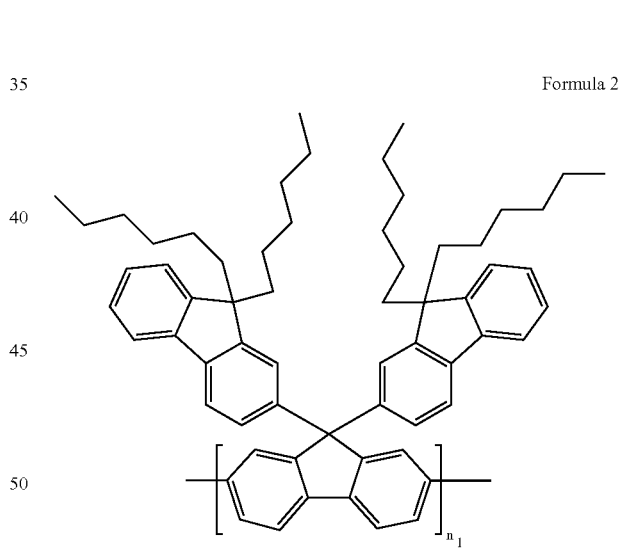

Formula 2

Wherein, $n_1$ is an integer of 1-100,000.

In a 500 ml Schrenk flask, 6 g (607 mmol) of compound (2) was dissolved in 66 ml of toluene degassed with nitrogen, and then stored in a nitrogen atmosphere. As catalysts, 3.576 g (12.74 mmol, 2.1 equivalents) of Ni(COD)$_2$, 1.392 g (12.74 mmol, 2.1 equivalents) of 1,4-cyclooctadiene (COD), 2.010 g (12.74 mmol, 2.1 equivalents) of dipyridyl were placed into the Schrenk flask under nitrogen, to which 33 ml of toluene degassed with nitrogen and 33 ml of DMF were added, followed by stirring at 80° C. for 30 min. The thus prepared monomer solution was added to the reaction vessel and the reaction occurred for 24 hours. The resultant reaction solution was mixed with 2 ml of bromobenzene, followed by reaction for 24 hours and then terminal completion. Thereafter, the reaction solution was added to 1500 ml of a solution of hydrochloric acid (35 wt %):acetone:ethanol=1:1:1, to remove an unreacted catalyst and precipitate a polymer. The polymer was filtered and dissolved in chloroform, followed by filtration with celite to remove the remaining catalyst. Concentration, reprecipitation in methanol and washing with Soxlet for 24 hours were performed. Yield: 69%, molecular weight: Mw=180,000 and Mn=58,000, and PDI(polydispersity)=3.1.

FIGS. 4 and 5 show a $^1$H-NMR spectrum of the monomer represented by the compound (2) and the electroluminescent polymer represented by Formula 2, respectively. From these drawings, it can be seen that the structures of the above monomer and polymer accord with each other. FIG. 6 shows a photoluminescence (PL) spectrum of the electroluminescent polymer represented by Formula 2 in the chloroform solution and the film, respectively, in which a maximum peak of the photoluminescence (PL) spectrum in the chloroform solution is 418 nm, corresponding to a blue luminescent region, and a shoulder peak is 442 nm. A maximum peak of the photoluminescence (PL) spectrum on the film is 427 nm, corresponding to a blue luminescent region, and a shoulder peak is 448 nm. Further, the peak by excimer, which is generally observed near 530 nm in the photoluminescence (PL) spectrum on a polyfluorene-based film, is not observed in the present invention. Thus, it can be confirmed that the present compound can be used as a material having high luminous efficiency.

EXAMPLE 10

Synthesis of Polymer of Formula 3 ($l_1$:$m_1$=95:5)

Wherein, $l_1$ is an integer of 1-100000, and $m_1$ is an integer of 1-100,000.

This polymer was prepared in the same manner as in Example 3, with the exception that 95% of the compound (2) and 5% of 4,4-dibromotriphenylamine were used as monomers. molecular weight: Mw=165,000 and Mn=61,000, and PDI(polydispersity)=2.7

EXAMPLE 11

Synthesis of Polymer of Formula 3 ($l_1$:$m_1$=90:10)

This polymer was prepared in the same manner as in Example 3, with the exception that 90% of the compound (2) and 10% of 4,4-dibromotriphenylamine were used as monomers. molecular weight: Mw=162,000 and Mn=56,000, and PDI(polydispersity)=2.9

EXAMPLE 12

Synthesis of Polymer of Formula 3 ($l_1$:$m_1$=85:15)

This polymer was prepared in the same manner as in Example 3, with the exception that 85% of the compound (2) and 15% of 4,4-dibromotriphenylamine were used as a monomer. molecular weight: Mw=157,000 and Mn=60,000, and PDI(polydispersity)=2.6

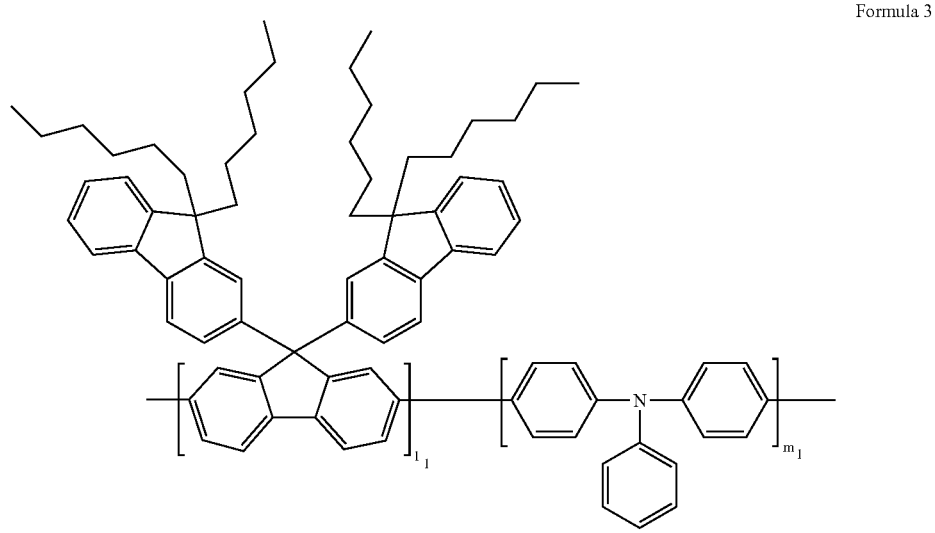

Formula 3

EXAMPLE 13

Synthesis of Polymer of Formula 4

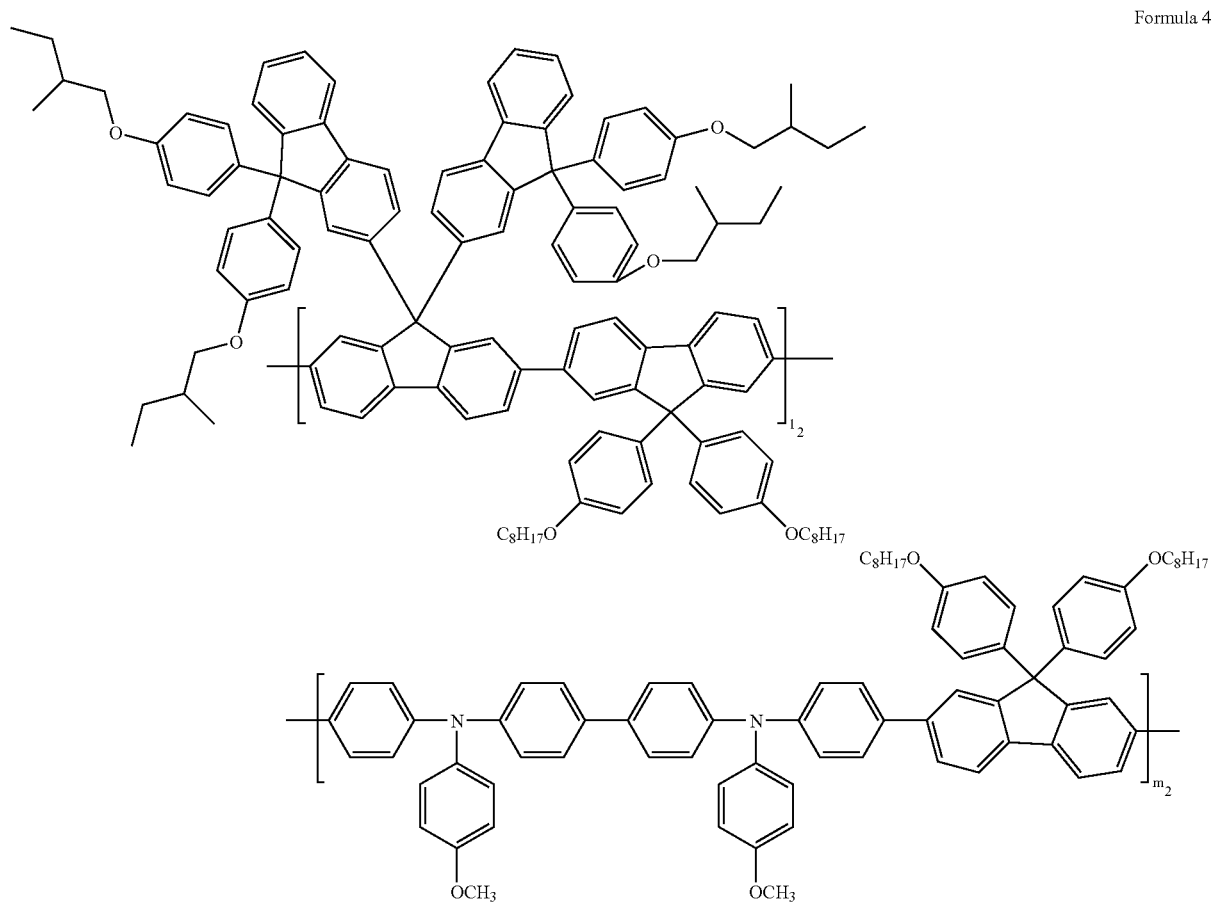

Formula 4

Wherein, $l_2$ is an integer of 1-100000, and $m_2$ is an integer of 1-100,000.

0.55 g of the compound (8), 0.38 g of 9,9-bis(4-octylphenyl)fluorene-2,7-bisboronic glycol ester, and 0.075 g of N,N-di(4-bromophenyl)-N,N-bis(4-methoxyphenyl)-[1,1-biphenyl]-4,4-diamine were dissolved in 10 ml of toluene, to which 2.5 ml of water, 0.55 g of $K_3PO_4$, 0.02 g of tricaprylyl methylammonium chloride were added, followed by bubbling with a nitrogen gas for 30 min. To the reaction mixture, 0.01 g of tetrakis triphenyl phosphine palladium (0) was added, followed by reaction at 89° C. for 24 hours. The resulting reaction solution was cooled to room temperature and precipitated in 200 ml of methanol to filter a polymer. The filtered polymer was then dissolved in chloroform and further filtered with celite, to remove the remaining catalyst. Concentration, reprecipitation in methanol and washing with Soxlet for 24 hours were performed. Yield: 72%, molecular weight: Mw=150,000 and Mn=63,000, and PDI(polydispersity)=2.4.

FIG. 8 shows a photoluminescence (PL) spectrum of the electroluminescent polymer represented by Formula 4 in a chloroform solution and a film, respectively. As apparent from this drawing, maximum peaks of the photoluminescence (PL) spectrum in the solution and on the film, respectively, are observed near 556 nm, corresponding to a blue luminescent region.

COMPARATIVE EXAMPLE 1

An electroluminescent polymer having the following repeating unit was synthesized in accordance with the method disclosed in WO 02/077060 (M.W.=180,000).

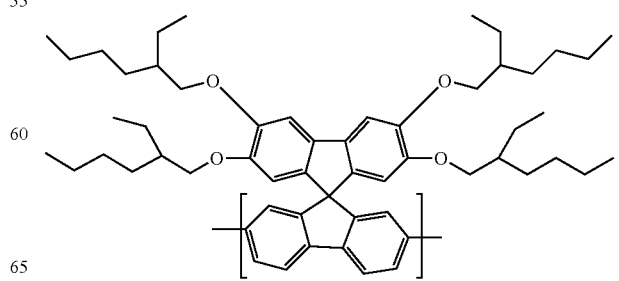

EXAMPLES 14-18 AND COMPARATIVE EXAMPLE 2

Fabrication of Electroluminescent Device

On a glass substrate, ITO (indium tin oxide) electrode was formed. Then, polymers for electroluminescent devices as given in Table 1, below, were spin-coated on the ITO electrode, to form light emitting layers being 600-1500 Å thick. Al:Li was vacuum deposited on the light emitting layer to form a 100-1200 Å thick aluminum lithium electrode, thereby fabricating an organic electroluminescent device, which was then measured for luminous characteristics. The results are provided in Table 1, below.

TABLE 1

| Ex. No. | Light Emitting Layer | Driving Voltage (v) | EL λmax (nm) | Max. Luminance (cd/m2) | Max. Effi. (cd/A) | Color Coordinate (x, y) | External Quantum Effi. (%) |
|---|---|---|---|---|---|---|---|
| 14 | Ex. 9 | 7.1 | 426, 447 | 467 | 0.716 | 0.160, 0.080 | 1.18 |
| 15 | Ex. 10 | 7.0 | 443 | 693 | 1.45 | 0.160, 0.090 | 1.94 |
| 16 | Ex. 11 | 6.5 | 439 | 740 | 1.08 | 0.159, 0.093 | 1.44 |
| 17 | Ex. 12 | 6.5 | 439 | 864 | 0.88 | 0.159, 0.096 | 1.16 |
| 18 | Ex. 13 | 6.0 | 455 | 720 | 0.64 | 0.160, 0.150 | 0.58 |
| C. Ex. 2 | C. Ex. 1 | 7.0 | 427, 450 | 206 | 0.03 | 0.165, 0.097 | 0.04 |

FIG. 7 shows the electroluminescent spectrum obtained from the electroluminescent device (Example 14) using the electroluminescent polymer represented by Formula 2, which has a maximum peak of 426 nm corresponding to a blue luminescent region and a shoulder peak of 447 nm. Such a narrow wavelength band results in high color purity, and the peak by excimer, which is generally observed near 530 nm in the electroluminescent spectrum of polyfluorenes-based polymers is not observed in the present invention. Thus, the polymer compound used can be found to be a material having high luminous efficiency. FIG. 9 shows the electroluminescent spectrum obtained from the electroluminescent device (Example 18) using the electroluminescent polymer represented by Formula 4, which has a maximum peak of 455 nm and exhibits high color purity due to a narrow wavelength band.

In the above table, the results of Example 14 show the characteristics of the electroluminescent device that is manufactured using the light emitting layer made of the compound of Example 9, which are unexpectedly excellent in the light of the characteristics of other polyfluorene-based polymers. In particular, the above device having x, y=0.160, 0.080 in a color coordinate system has a color coordinate system substantially according with NTSC standard blue. Further, external quantum efficiency of 1.18% is regarded as the highest value in homopolyfluorenes known until now. As with Examples 15, 16, 17 and 18 using amine-based Ar moiety in Formula 1, it appears that a driving initiation voltage decreases. Particularly, in Example 15, it can be seen that quantum efficiency remarkably increases. This is because the substituent has a structure like the main chain due to introduction of a fluorenyl group as a bulky substituent, resulting in random arrangement between the main chain and the substituent. In addition, aggregation and intermolecular excimer formation by the substituent are inhibited, thus preventing the aggregation and/or excimer formation regarded as the biggest problems in the fields of polyfluorene-based polymers. Also, intramolecular or intermolecular energy transfer to the main chain from the substituent having a short wavelength can be realized. By the substituted fluorenyl group at the 9-position of fluorene as the main chain, rotation and vibronic modes are suppressed, to dramaically reduce nonradiative decay. Therefore, the organic electroluminescent polymer of the present invention has high luminous efficiency, and the organic electroluminescent device using the same has high color purity, high luminance and high efficiency. Consequently, the electroluminescent polymer of the present invention is suitable for commercial use of the electroluminescent device.

INDUSTRIAL APPLICABILITY

As described above, the present invention provides an organic electroluminescent polymer having a 9,9-di(fluorenyl)-2,7-fluorenyl unit and an organic electroluminescent device manufactured using the same. The electroluminescent polymer of the present invention has superior heat stability, high luminous efficiency and high solubility, and serves to minimize the interaction of molecules. Further, the above polymer can alleviate the disadvantages of conventional polyfluorene-based polymers, and be used as a host material for blue, green and red luminescence of the electroluminescent device, thus exhibiting superior luminous characteristics.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. An organic electroluminescent polymer having 9,9-di (fluorenyl)-2,7-fluorenyl unit represented by the following Formula 1:

Formula 1:

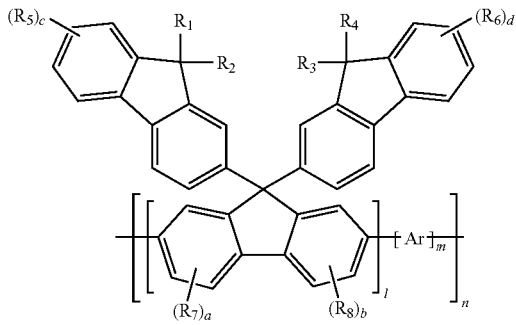

wherein, $R_1$, $R_2$, $R_3$ and $R_4$ are the same or different, each being a linear or branched alkyl group of 1-20 carbons; an aryl group which is unsubstituted or substituted with at least one substituent group selected from the group consisting of linear or branched alkyl and alkoxy groups of 1-20 carbons; a linear or branched alkyl group of 1-20 carbons having at least one hetero-atom selected from the group consisting of F, S, N, O, P and Si; an aryl group which is substituted with at least one substituent group selected from the group consisting of linear or branched alkyl and alkoxy groups of 1-20 carbons containing at least one hetero-atom selected from the group consisting of F, S, N, O, P and Si; an aryl group having a heterocyclic moiety of 2-24 carbons which is unsubstituted or substituted with at least one substituent group selected from the group consisting of linear or branched alkyl and alkoxy groups of 1-20 carbons; an aryl group having a heterocyclic moiety of 2-24 carbons which is substituted with at least one substituent group selected from the group consisting of linear or branched alkyl and alkoxy groups of 1-20 carbons containing at least one hetero-atom selected from the group consisting of F, S, N, O, P and Si; a substituted or unsubstituted trialkylsilyl group of 3-40 carbons; a substituted or unsubstituted arylsilyl group of 3-40 carbons; a substituted or unsubstituted carbazole group of 12-60 carbons; a substituted or unsubstituted phenothiazine group of 6-60 carbons; or a substituted or unsubstituted arylamine group of 6-60 carbons; $R_5$, $R_6$, $R_7$ and $R_8$ are the same or different, each being hydrogen; a linear or branched alkyl or alkoxy group of 1-20 carbons; an aryl group which is unsubstituted or substituted with at least one substituent group selected from the group consisting of linear or branched alkyl and alkoxy groups of 1-20 carbons; a linear or branched alkyl or alkoxy group of 1-20 carbons having at least one hetero-atom selected from the group consisting of F, S, N, O, P and Si; an aryl group which is substituted with at least one substituent group selected from the group consisting of linear or branched alkyl and alkoxy groups of 1-20 carbons containing at least one hetero-atom selected from the group consisting of F, S, N, O, P and Si; an aryl group having a heterocyclic moiety of 2-24 carbons which is unsubstituted or substituted with at least one substituent group selected from the group consisting of linear or branched alkyl and alkoxy groups of 1-20 carbons; an aryl group having a heterocyclic moiety of 2-24 carbons which is substituted with at least one substituent group selected from the group consisting of linear or branched alkyl and alkoxy groups of 1-20 carbons containing at least one hetero-atom selected from the group consisting of F, S, N, O, P and Si; a substituted or unsubstituted trialkylsilyl group of 3-40 carbons; a substituted or unsubstituted arylsilyl group of 3-40 carbons; a substituted or unsubstituted carbazole group of 12-60 carbons; a substituted or unsubstituted phenothiazine group of 6-60 carbons; or a substituted or unsubstituted arylamine group of 6-60 carbons; a, b, c and d are the same or different, each being an integer of 1-3; Ar is selected from the group consisting of a substituted or unsubstituted aromatic moiety of 6-60 carbons, a substituted or unsubstituted heteroaromatic moiety of 2-60 carbons, and combinations thereof; and l is an integer of 1-100,000, m is an integer of 0-100,000, and n is an integer of 1-100,000.

2. The organic electroluminescent polymer as set forth in claim 1, wherein said $R_1$, $R_2$, $R_3$ and $R_4$, respectively are selected from the following group:

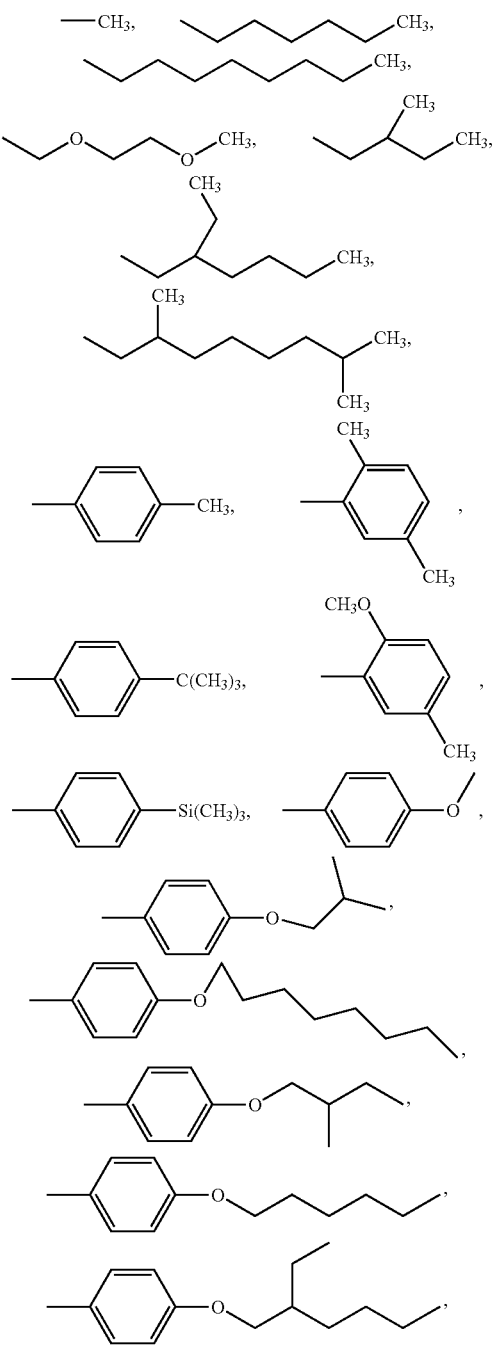

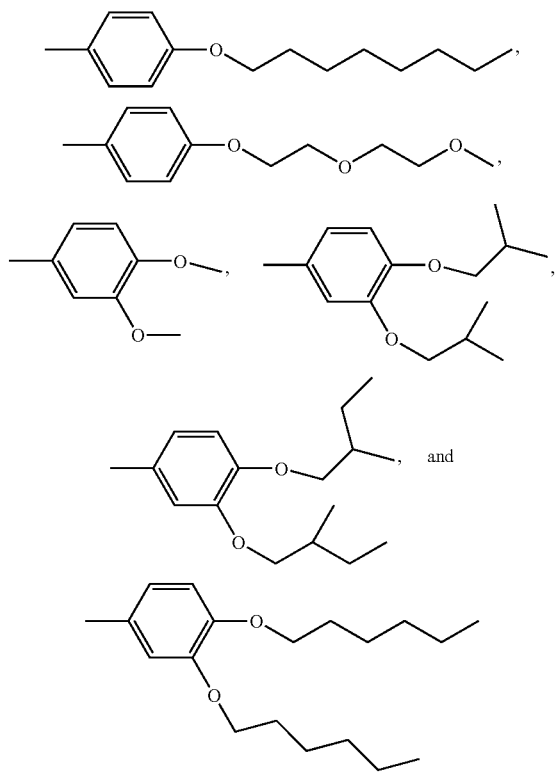
3. The organic electroluminescent polymer as set forth in claim 1, wherein said $R_5$ and $R_6$, respectively are selected from the following group:
H,
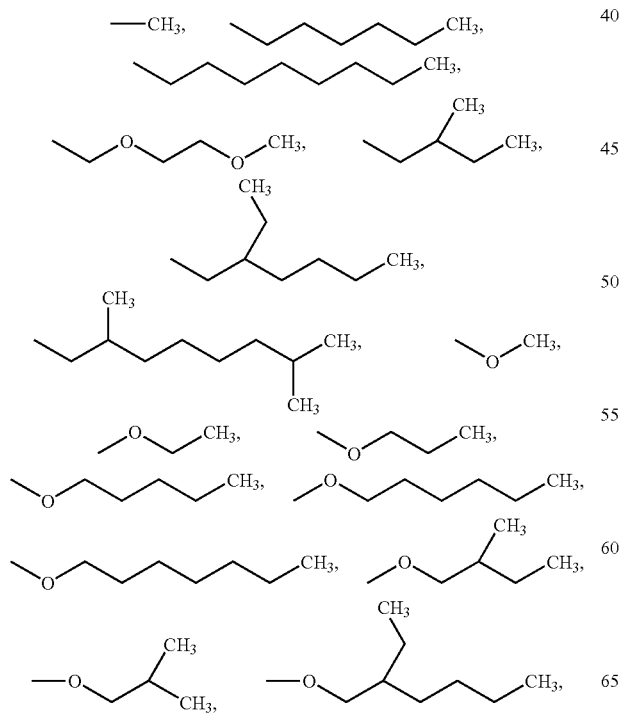
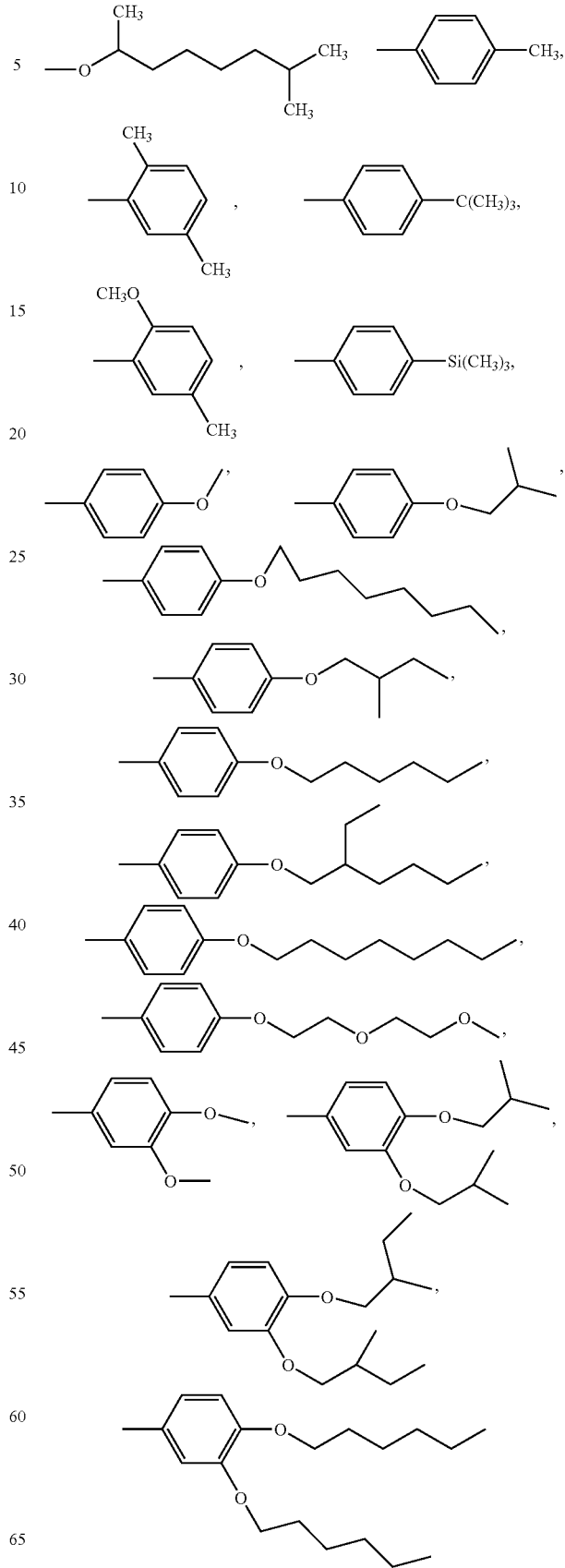

-continued

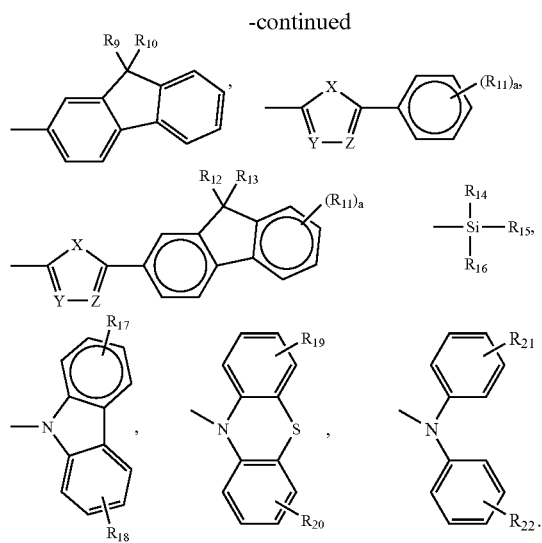

wherein, $R_9$ and $R_{10}$ are the same or different, and respectively are a linear or branched alkyl group of 1-20 carbons;

$R_{11}$ is hydrogen or a linear or branched alkyl, alkoxy or trialkylsilyl group of 1-20 carbons;

$R_{12}$ and $R_{13}$ are the same or different, and respectively are a linear or branched alkyl group of 1-20 carbons;

$R_{14}$, $R_{15}$ and $R_{16}$ are the same or different, and respectively are a linear or branched alkyl or alkoxy group of 1-20 carbons; or an aryl group which is unsubstituted or substituted with at least one substituent group selected from the group consisting of linear or branched alkyl and alkoxy groups of 1-20 carbons;

$R_{17}$, $R_{18}$, $R_{19}$, $R_{20}$, $R_{21}$ and $R_{22}$ are the same or different, and respectively are hydrogen; a linear or branched alkyl or alkoxy group of 1-20 carbons; or an aryl group which is unsubstituted or substituted with at least one substituent group selected from the group consisting of linear or branched alkyl and alkoxy groups of 1-20 carbons;

X is O or S;

Y and Z are N; and a is an integer of 1-3.

4. The organic electroluminescent polymer as set forth in claim 1, wherein said $R_7$ and $R_8$, respectively are selected from the following group:

H,

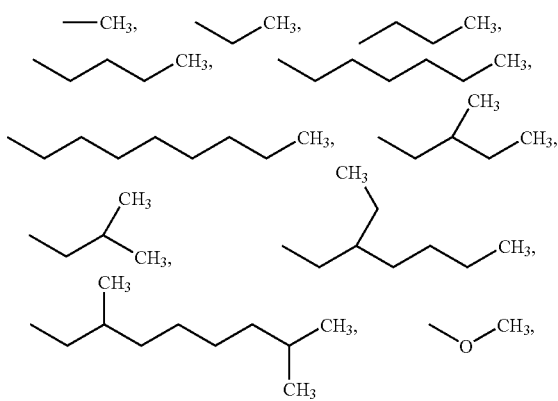

-continued

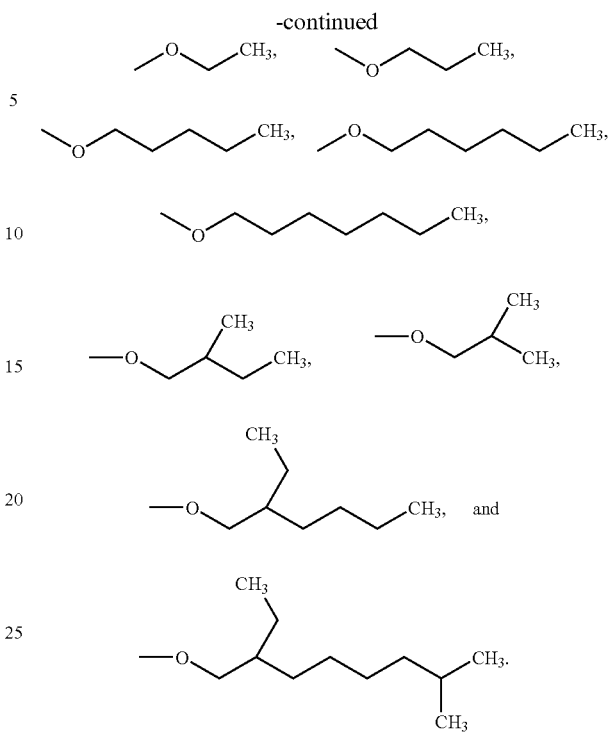

5. The organic electroluminescent polymer as set forth in claim 1, wherein said Ar is selected from the following group:

(i) a substituted or unsubstituted arylene group of 6-60 carbons;

(ii) a substituted or unsubstituted heterocyclic arylene group of 2-60 carbons in which at least one hetero-atom selected from the group consisting of N, S, O, P and Si is incorporated in an aromatic ring;

(iii) a substituted or unsubstituted arylenevinylene group of 6-60 carbons;

(iv) a substituted or unsubstituted arylamine group of 6-60 carbons;

(v) a substituted or unsubstituted carbazole group of 12-60 carbons; and (vi) combinations thereof, in which Ar may include a substituent selected from the group consisting of a linear or branched alkyl or alkoxy group of 1-20 carbons; an aryl group which is unsubstituted or substituted with at least one substituent group selected from the group consisting of linear or branched alkyl and alkoxy groups of 1-20 carbons; a cyano group (—CN); and a silyl group.

6. The organic electroluminescent polymer as set forth in claim 5, wherein said Ar is present in an amount of 5-15 mol % in the electroluminescent polymer, with proviso of being a substituted or unsubstituted arylamine group of 6-60 carbons.

7. The organic electroluminescent polymer as set forth in claim 1, wherein a ratio of 1:m ranges from 5:95 to 95:5.

8. The organic electroluminescent polymer as set forth in claim 1, wherein the organic electroluminescent polymer has the following Formula 2:

Formula 2

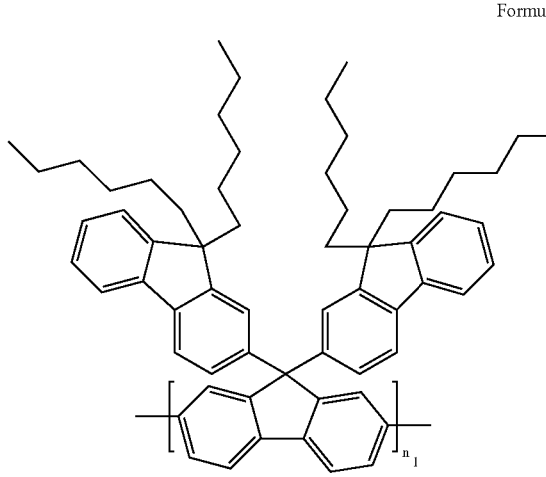

wherein, $n_1$ is an integer from 1 to 100,000.

9. The organic electroluminescent polymer as set forth in claim 1, wherein the organic electroluminescent polymer has the following Formula 3:

Formula 3

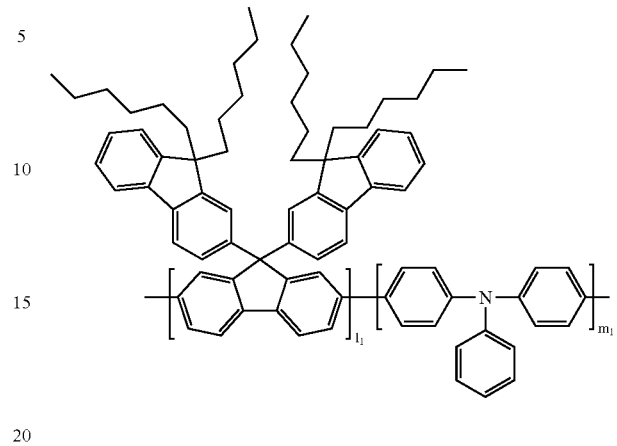

wherein, $l_1$ is an integer from 1 to 100,000, and $m_1$ is an integer from 1 to 100,000.

10. The organic electroluminescent polymer as set forth in claim 1, wherein the organic electroluminescent polymer has the following Formula 4:

Formula 4

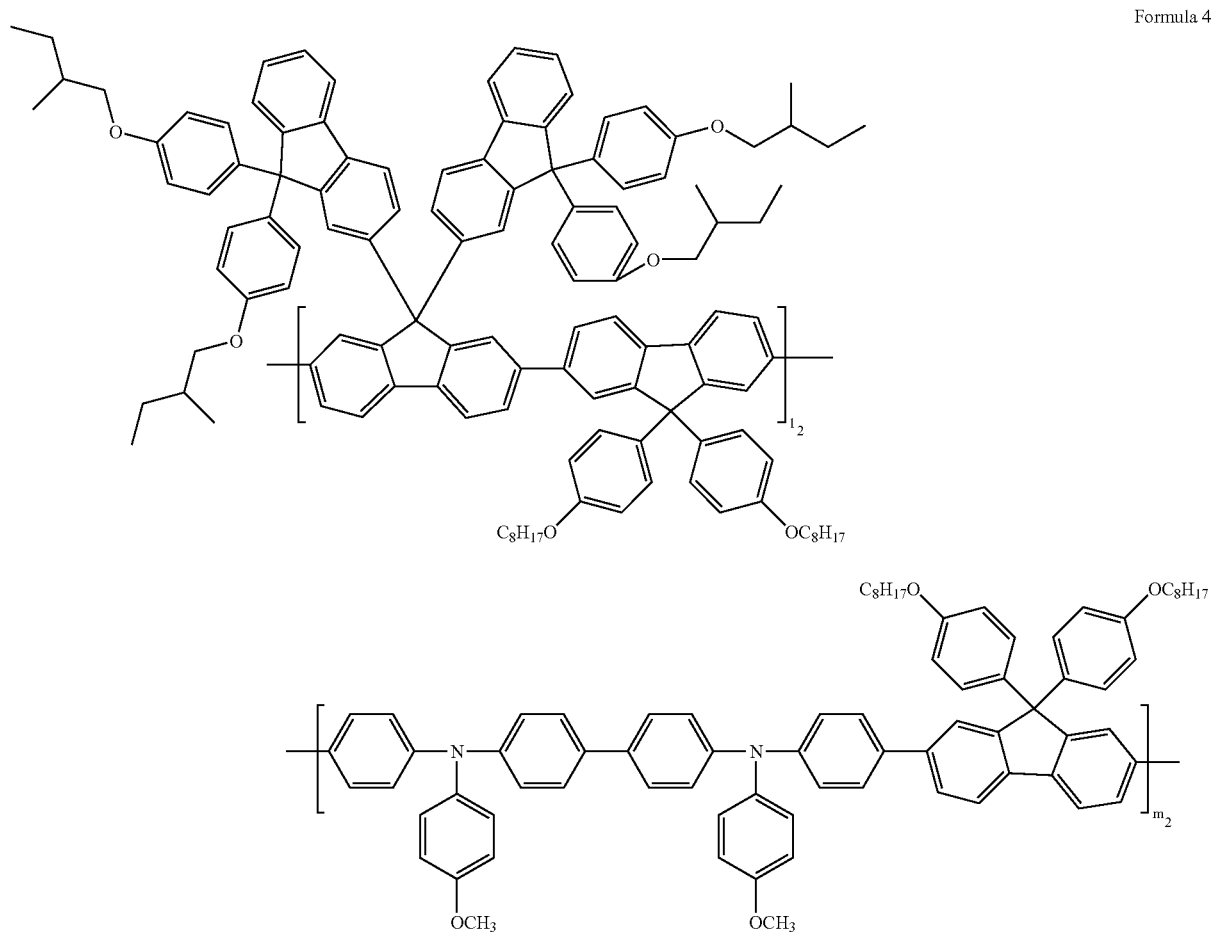

wherein, $l_2$ is an integer from 1 to 100,000, and $m_2$ is an integer from 1 to 100,000.

11. An organic electroluminescent device having at least one layer comprising the polymer according to claim 1 between an anode and a cathode, wherein, the layer is a hole-transport layer, a light emitting layer, an electron-transport layer or a hole blocking layer.

12. The organic electroluminescent device as set forth in claim 11, wherein the electroluminescent device comprises a structure of anode/light emitting layer/cathode, anode/hole transport layer/light emitting layer/cathode, or anode/hole transport layer/light emitting layer/electron transport layer/cathode.

* * * * *